United States Patent
Ito et al.

(10) Patent No.: US 11,636,972 B2
(45) Date of Patent: *Apr. 25, 2023

(54) MULTILAYER SUBSTRATE AND METHOD OF MANUFACTURING THE SAME

(71) Applicant: Murata Manufacturing Co., Ltd., Nagaokakyo (JP)

(72) Inventors: Shingo Ito, Nagaokakyo (JP); Naoki Gouchi, Nagaokakyo (JP); Hirotaka Fujii, Nagaokakyo (JP); Kazutaka Muraoka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/751,794

(22) Filed: May 24, 2022

(65) Prior Publication Data
US 2022/0285083 A1 Sep. 8, 2022

Related U.S. Application Data

(63) Continuation of application No. 16/212,720, filed on Dec. 7, 2018, now Pat. No. 11,373,793, which is a (Continued)

(30) Foreign Application Priority Data

Jun. 22, 2016 (JP) .............................. JP2016-123236
Aug. 31, 2016 (JP) .............................. JP2016-169579

(51) Int. Cl.
*H01F 27/28* (2006.01)
*H01F 17/00* (2006.01)
(Continued)

(52) U.S. Cl.
CPC ..... *H01F 27/2804* (2013.01); *H01F 17/0013* (2013.01); *H01F 27/323* (2013.01);
(Continued)

(58) Field of Classification Search
USPC ......................................... 336/200, 232, 192
See application file for complete search history.

(56) References Cited

U.S. PATENT DOCUMENTS

| 2007/0199734 A1* | 8/2007 | Kudo ................... H05K 3/0052 29/25.35 |
| 2014/0077914 A1* | 3/2014 | Ohkubo ................... H01F 1/06 75/255 |

(Continued)

OTHER PUBLICATIONS

Ito et al., "Multilayer Substrate and Method of Manufacturing the Same", U.S. Appl. No. 16/212,720, filed Dec. 7, 2018.

*Primary Examiner* — Shawki S Ismail
*Assistant Examiner* — Kazi S Hossain
(74) *Attorney, Agent, or Firm* — Keating & Bennett, LLP

(57) ABSTRACT

A multilayer substrate includes a stacked body of insulating base material layers and conductor patterns on the insulating base material layers. A thickness adjustment base material layer includes a frame portion, an opening portion inside the frame portion, and an island shaped portion inside the frame portion, and connection portions to connect the island shaped portion to the frame portion. The conductor patterns, in a stacking direction of the insulating base material layers, are wound around the island shaped portion. A line width of the connection portions is smaller than the width of the island shaped portion connected to the frame portion through the connection portions. An area overlapped with the conductor patterns is larger in the opening portion than in the frame portion and the island shaped portion.

10 Claims, 17 Drawing Sheets

Related U.S. Application Data continuation of application No. PCT/JP2017/020190, filed on May 31, 2017.

(51) Int. Cl.
| | | |
|---|---|---|
| *H01F 27/32* | (2006.01) | |
| *H01F 41/04* | (2006.01) | |
| *H01F 41/12* | (2006.01) | |
| *H05K 1/16* | (2006.01) | |
| *H01F 27/29* | (2006.01) | |

(52) U.S. Cl.
CPC ......... *H01F 41/041* (2013.01); *H01F 41/122* (2013.01); *H01F 27/29* (2013.01); *H01F 27/292* (2013.01); *H05K 1/165* (2013.01)

(56) References Cited

U.S. PATENT DOCUMENTS

2016/0012950 A1* 1/2016 Nishino ............. H02K 41/0356
216/13
2017/0338172 A1* 11/2017 Yosui ................ H01L 23/49822

\* cited by examiner

MULTILAYER SUBSTRATE AND METHOD OF MANUFACTURING THE SAME

CROSS REFERENCE TO RELATED APPLICATIONS

This application claims the benefit of priority to Japanese Patent Application No. 2016-123236 filed on Jun. 22, 2016 and Japanese Patent Application No. 2016-169579 filed on Aug. 31, 2016, and is a Continuation Application of PCT Application No. PCT/JP2017/020190 filed on May 31, 2017. The entire contents of each application are hereby incorporated herein by reference.

BACKGROUND OF THE INVENTION

1. Field of the Invention

The present invention relates to a multilayer substrate, and more particularly relates to a multilayer substrate including a stacked body including a plurality of insulating base material layers, and a conductor pattern provided in contact with the stacked body, and a method of manufacturing such a multilayer substrate.

2. Description of the Related Art

Conventionally, a multilayer substrate obtained by stacking a plurality of insulating base material layers on which a conductor pattern is provided has been known. Generally, in a case in which a plurality of insulating base material layers on a conductor pattern is provided are stacked on each other, a thickness of the conductor is added to the thickness of a portion on which the conductor pattern is provided, so that the thickness in a stacking direction in which the plurality of insulating base material layers are stacked is larger than the thickness of other portions, which may not ensure the flatness of the multilayer substrate.

Accordingly, Japanese Unexamined Patent Application Publication No. 2008-166385, for example, discloses a multilayer substrate including a stacked body configured by stacking an insulating base material layer on which a conductor pattern is provided, and a thickness adjustment base material layer in which an opening portion having a shape corresponding to the shape of the conductor pattern is provided, and by heating and pressing the stacked insulating base material layer and thickness adjustment base material layer. With the above configuration, since the insulating base material layer and the thickness adjustment base material layer are stacked so that the conductor pattern may be located within the opening portion provided on the thickness adjustment base material layer, a multilayer substrate with a flatness that is easily ensured is able to be obtained.

However, in the structure disclosed in Japanese Unexamined Patent Application Publication No. 2008-166385, in a case in which the conductor pattern has a winding shape, an island shaped portion partially connected to the thickness adjustment base material layer is provided inside of the opening portion, and this island shaped portion surrounded by the opening portion is easy to deform. Therefore, it may become difficult to stack a plurality of insulating base material layers.

SUMMARY OF THE INVENTION

In view of the foregoing, preferred embodiments of the present invention provide, with a simple configuration, multilayer substrates each including a thickness adjustment base material layer with a flatness that is easily ensured.

A multilayer substrate according to a preferred embodiment of the present invention includes a stacked body including a plurality of insulating base material layers; a conductor pattern provided on at least one of the plurality of insulating base material layers; and a dummy conductor, and the plurality of insulating base material layers includes a conductor containing base material layer on which the conductor pattern is provided; and a thickness adjustment base material layer, the thickness adjustment base material layer includes a base material portion; and a base material omitted portion in which the base material portion is not provided, the dummy conductor is provided on the thickness adjustment base material layer and is electrically isolated from the conductor pattern, and the base material omitted portion, when viewed in a stacking direction in which the plurality of insulating base material layers are stacked, includes an area overlapped with the conductor pattern, the area being larger than an area in which the base material portion is overlapped with the conductor pattern.

With this configuration, since the plurality of insulating base material layers are stacked so that the conductor pattern may be overlapped with the base material omitted portion, the flatness of the multilayer substrate is ensured. In addition, according to this configuration, it becomes easy to stack a plurality of insulating base material layers and also becomes easy to manufacture a multilayer substrate with a flatness that is easily ensured. Further, according to this configuration, the thickness of the multilayer substrate is able to be adjusted using a dummy conductor, and a range in which the thickness of the multilayer substrate is adjusted is able to be increased. The plurality of insulating base material layers may preferably be made of thermoplastic resin. According to this configuration, since the plurality of insulating base material layers (resin) flow during heating and pressing when the stacked body is formed, irregularities that might occur on the surface of the multilayer substrate are significantly reduced or prevented.

The conductor pattern may preferably define a coil. When the conductor pattern defines a coil, the conductor pattern may be disposed in a high density manner in a planar direction in many cases in order to ensure a predetermined inductance and a predetermined number of turns. In such a case, the thickness of the conductor pattern may be increased in many cases in order to reduce a conductor loss. Even with this configuration, the plurality of insulating base material layers are stacked such that the conductor pattern may be overlapped with the base material omitted portion of the thickness adjustment base material layer, and thus the flatness of the multilayer substrate is ensured.

The base material omitted portion may preferably be an opening provided inside of the base material portion; the thickness adjustment base material layer may preferably include an island shaped portion disposed inside of the base material omitted portion; and a plurality of connection portions; at least a portion of the conductor pattern may preferably be wound around the island shaped portion when viewed in the stacking direction; a line width of the plurality of connection portions may preferably be smaller than a width of the island shaped portion; the island shaped portion may preferably be connected to the base material portion through the plurality of connection portions; and the base material omitted portion, when viewed in the stacking direction, may preferably include an area overlapped with the conductor pattern, the area being larger than an area in which the island shaped portion is overlapped with the conductor pattern. According to this configuration, in comparison with a case in which the island shaped portion is connected to the base material portion through a single connection portion, the island shaped portion is stably fixed to the base material portion. Therefore, it becomes easy to stack a plurality of insulating base material layers and also becomes easy to manufacture a multilayer substrate with a flatness that is easily ensured.

A geometric gravity center of the island shaped portion may preferably be located in a maximum region surrounded by a straight line connecting a plurality of boundaries between the plurality of connection portions and the base material portion. With this configuration, the island shaped portion is more stably fixed to the base material portion. Accordingly, the thickness adjustment base material layer is further significantly reduced or prevented from deforming when the plurality of insulating base material layers are stacked.

The dummy conductor, when viewed in the stacking direction, may preferably be disposed at a position that is not overlapped with the conductor pattern. According to this configuration, since the insulating base material layer (resin) of a portion overlapped with the conductor pattern is easy to flow during heating and pressing when the stacked body is formed, irregularities do not easily occur on the surface of the multilayer substrate.

The thickness adjustment base material layer may preferably include a plurality of thickness adjustment base material layers. According to this configuration, even when a thickness per layer of the thickness adjustment base material layers is reduced, irregularities that might occur on the surface of the multilayer substrate are significantly reduced or prevented. In addition, a plurality of thickness adjustment base material layers having a small thickness per layer are provided, in comparison with a case in which one thickness adjustment base material layer having a large thickness is provided, the amount of the insulating base material layers flowing into the base material omitted portion of the layer of the plurality of thickness adjustment base material layers when being stacked is reduced (dispersed). Accordingly, the deformation and positional displacement of the conductor pattern caused by the insulating base material layers flowing into the base material omitted portion are significantly reduced or prevented, and a characteristic change caused by the deformation and positional displacement of the conductor pattern may be also difficult to occur.

The plurality of connection portions respectively provided on the plurality of thickness adjustment base material layers may preferably be disposed at positions at which the plurality of connection portions provided on the plurality of thickness adjustment base material layers are not overlapped with each other when viewed in the stacking direction. According to this configuration, when viewed in the stacking direction, in comparison with a case in which the connection portions respectively provided on different insulating base material layers are overlapped with each other, irregularities that might occur on the surface of the multilayer substrate with this configuration are significantly reduced or prevented, which improves the flatness of the multilayer substrate.

The conductor containing base material layer may preferably include a plurality of conductor containing base material layers; the plurality of conductor containing base material layers may preferably include an interlayer connection conductor to connect a plurality of conductor patterns respectively provided on the plurality of conductor containing base material layers; and the interlayer connection conductor may preferably be overlapped with the base material omitted portion when viewed in the stacking direction. According to this configuration, since the interlayer connection conductor that is not easily contracted in the stacking direction during heating and pressing is located in a portion in which an insulating base material layer is not located, the flatness of the multilayer substrate is able to be improved.

A method of manufacturing a multilayer substrate according to a preferred embodiment of the present invention, includes a conductor forming step of forming a conductor pattern on an insulating base material layer among the plurality of insulating base material layers to define the conductor containing base material layer; a thickness adjustment base material layer forming step of forming a base material portion and a base material omitted portion in which the base material portion is not formed, on an insulating base material layer other than the insulating base material layer on which the conductor pattern is formed to define the thickness adjustment base material layer; and a stacked body forming step of stacking the conductor containing base material layer and the thickness adjustment base material layer such that the base material omitted portion is overlapped with the conductor pattern to define a stacked body by heating and pressing the plurality of insulating base material layers that have been stacked, and the thickness adjustment base material layer forming step includes a dummy conductor forming step of forming a dummy conductor in a region in which an overlap between conductor patterns is small when viewed in a stacking direction in which the plurality of insulating base material layers are stacked, the dummy conductor being electrically isolated from the conductor pattern, the region being included in the thickness adjustment base material layer.

According to this manufacturing method, it becomes easy to stack a plurality of insulating base material layers including a thickness adjustment base material layer, and it is possible to easily manufacture a multilayer substrate with a flatness that is easily ensured.

The thickness adjustment base material layer forming step may preferably include a step of forming an island shaped portion disposed inside of the base material omitted portion and a plurality of connection portions to connect the island shaped portion to the base material portion, on the thickness adjustment base material layer.

Various preferred embodiments of the present invention provide multilayer substrates each including a thickness adjustment base material layer that easily ensures flatness with a simple configuration.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
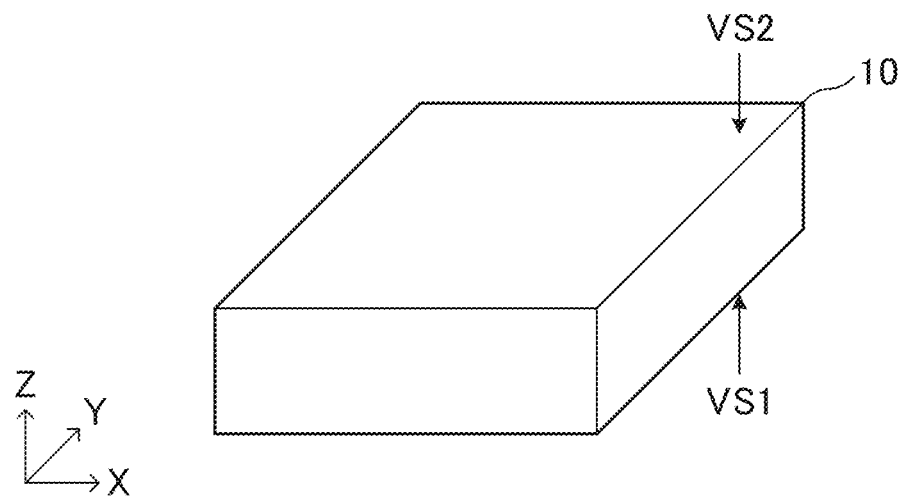
FIG. 1 is a perspective view of a multilayer substrate 101 according to a first preferred embodiment of the present invention.

Hereinafter, a plurality of preferred embodiments of the present invention will be described with reference to the attached drawings and several specific examples. In the drawings, the same components and elements are denoted by the same reference signs. While preferred embodiments are divided and described for the sake of convenience in consideration of ease of description or understanding of main points, elements described in different preferred embodiments are able to be partially replaced and combined with each other. In the second and subsequent preferred embodiments, a description of features and elements common to the first preferred embodiment will be omitted, and only different features and elements are described. In particular, the same or similar operational effects achieved by the same or similar structure will not be repeated in each preferred embodiment.

First Preferred Embodiment

Figure 2:
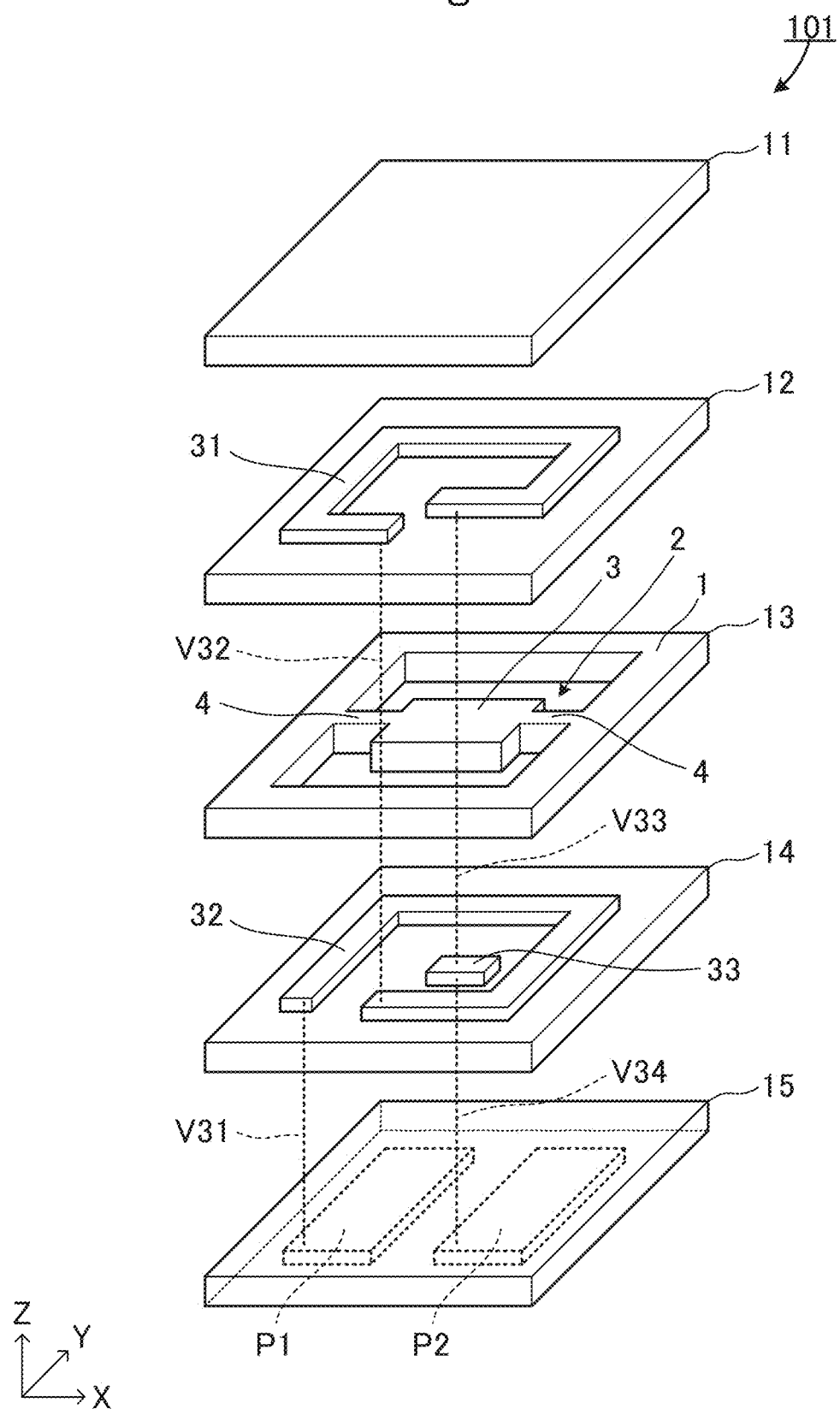
FIG. 2 is an exploded perspective view of the multilayer substrate 101 according to the first preferred embodiment of the present invention.
Figure 3A:
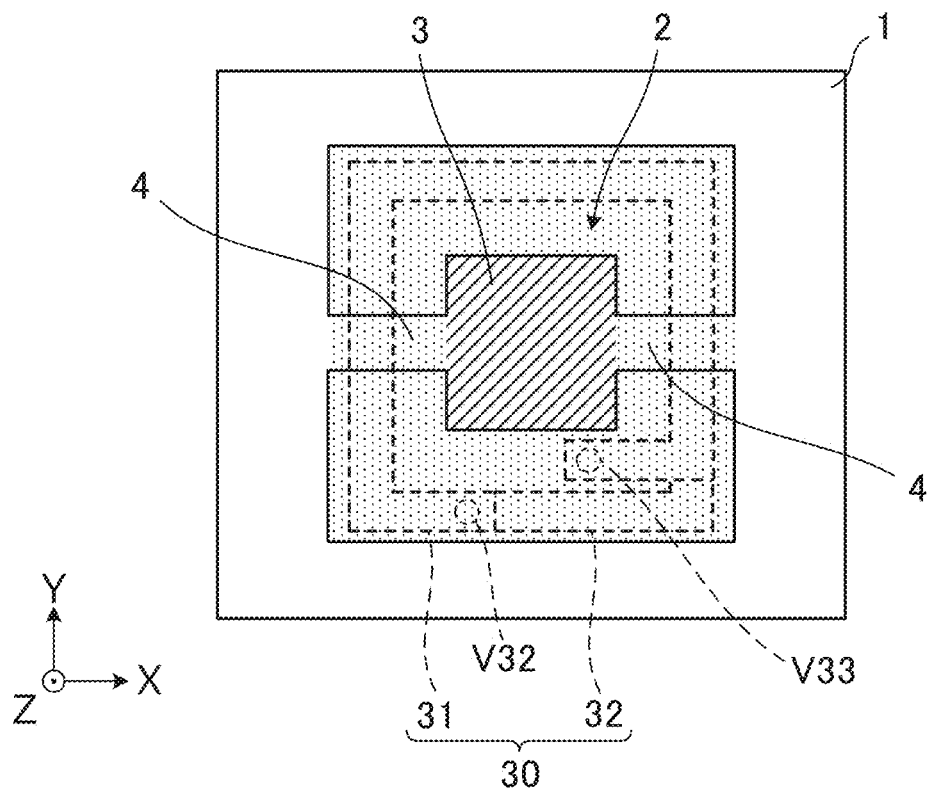
FIG. 3A is a plan view of an insulating base material layer 13, illustrating a frame portion 1, an opening portion 2, an island shaped portion 3, and a connection portion 4.
Figure 3B:
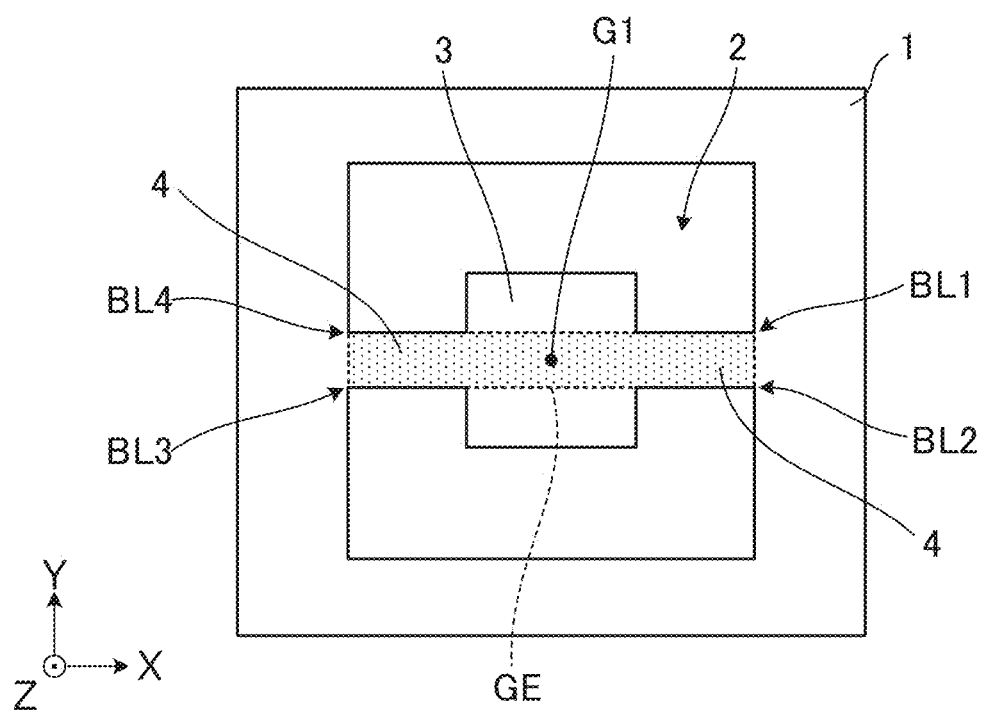
FIG. 3B is a plan view of the insulating base material layer 13, illustrating a positional relationship between a geometric gravity center G1 of the island shaped portion 3, and the connection portion 4.

FIG. 1 is a perspective view of a multilayer substrate 101 according to a first preferred embodiment of the present invention. FIG. 2 is an exploded perspective view of the multilayer substrate 101 according to the first preferred embodiment of the present invention. FIG. 3A is a plan view of an insulating base material layer 13, illustrating a frame portion 1, an opening portion 2, an island shaped portion 3, and a connection portion 4, and FIG. 3B is a plan view of the insulating base material layer 13, illustrating a positional relationship between a geometric gravity center G1 of the island shaped portion 3, and the connection portion 4. In FIG. 3A, in order to make the structure more understandable, the opening portion 2 is indicated by a dot pattern and the island shaped portion 3 is indicated by hatching. In addition, in FIG. 3B, a maximum region GE is indicated by a dot pattern.

The multilayer substrate 101 includes a stacked body 10 formed by stacking a plurality of insulating base material layers 11, 12, 13, 14, and 15, and conductor patterns 31, 32, and 33 that are provided on the insulating base material layers 12 and 14.

The stacked body 10 preferably has a rectangular or substantially rectangular parallelepiped shape and is made of thermoplastic resin, for example, and includes a first principal surface VS1 and a second principal surface VS2 that faces the first principal surface VS1. The plurality of insulating base material layers 11, 12, 13, 14, and 15 are each a sheet-shaped flat plate having a rectangular or substantially rectangular planar shape and made of thermoplastic resin including a liquid crystal polymer, for example, as a main material.

The plurality of insulating base material layers 11, 12, 13, 14, and 15 include a "conductor containing base material layer" on which a conductor pattern is provided, and a "thickness adjustment base material layer." In the first preferred embodiment, each of the insulating base material layers 12 and 14 is the "conductor containing base material layer," and the insulating base material layer 13 is the "thickness adjustment base material layer." In the present preferred embodiment, the insulating base material layer 11 is the uppermost layer.

The conductor pattern 31 is provided on the surface of the insulating base material layer 12. The conductor pattern 31 is a rectangular or substantially rectangular loop shaped conductor including about one turn wound along the outer periphery of the insulating base material layer 11. The conductor pattern 31 is a conductor pattern made of a material such as a Cu foil, for example.

The insulating base material layer 13, as illustrated in FIG. 3A, includes a frame portion 1, an opening portion 2, an island shaped portion 3, and two connection portions 4. The frame portion 1 is a frame shaped portion obtained by removing the opening portion 2 from the insulating base material layer 13, and includes the outer periphery of the insulating base material layer 13. The opening portion 2 is a through hole provided inside of the frame portion 1 and having a rectangular or substantially rectangular planar shape. When the plurality of insulating base material layers 11, 12, 13, 14, and 15 are stacked, the opening portion 2 is provided at positions overlapped with the conductor patterns 31 and 32, when viewed in a stacking direction (the Z-axis direction) in which the plurality of insulating base material layers 11, 12, 13, 14, and 15 are stacked. The island shaped portion 3 is a rectangular or substantially rectangular shaped island-shaped portion disposed at the center of the inside (the inside of the opening portion 2) of the frame portion 1. The two connection portions 4 are linear portions extending in the X-axis direction. The island shaped portion 3 is connected to the frame portion 1 through the two connection portions 4. In addition, as illustrated in FIG. 3A, the line width (the width in the Y-axis direction) of the connection portions 4 is smaller than the width (the width in the Y-axis direction) of the island shaped portion 3.

The conductor patterns 32 and 33 are provided on the surface of the insulating base material layer 14. The conductor pattern 32 is a rectangular or substantially rectangular loop shaped conductor including about one turn wound along the outer periphery of the insulating base material layer 14. The conductor pattern 33 is a rectangular or substantially rectangular conductor disposed in a region surrounded by the conductor pattern 32. The conductor patterns 32 and 33 are conductor patterns made of a material such as a Cu foil, for example. It is to be noted that the conductor pattern 33 (as described in detail later) to connect an interlayer connection conductor V33 and an interlayer connection conductor V34 is not essential.

The insulating base material layer 15 is the lowermost layer. Two mounting electrodes P1 and P2 are provided on the rear surface of the insulating base material 15. The mounting electrodes P1 and P2 are conductors having a rectangular or substantially rectangular shape of which the longitudinal direction coincides with the Y-axis direction. The mounting electrodes P1 and P2 according to the first preferred embodiment are respectively disposed in the vicinity of the first side (the left side of the insulating base material layer 15 in FIG. 2) of the insulating base material layer 15 and in the vicinity of the second side (the right side of the insulating base material layer 15) of the insulating base material layer 15. The mounting electrodes P1 and P2 are conductor patterns made of a material such as a Cu foil, for example.

As illustrated in FIG. 2, the mounting electrode P1 is connected to the first end of the conductor pattern 32 through an interlayer connection conductor V31 respectively provided on the insulating base material layers 14 and 15. The second end of the conductor pattern 32 is connected to the first end of the conductor pattern 31 through an interlayer connection conductor V32 provided on the insulating base material layer 12. The second end of the conductor pattern 31 is connected to the conductor pattern 33 through an interlayer connection conductor V33 provided on the insulating base material layer 12. The conductor pattern 33 is connected to the mounting electrode P2 through an interlayer connection conductor V34 provided on the insulating base material layers 14 and 15.

As described above, in the multilayer substrate 101, the conductor patterns 31, 32, and 33 that are each provided on the plurality of insulating base material layers 12 and 14, and the interlayer connection conductors V32 and V33 define a coil 30 having a rectangular or substantially rectangular helical shape including about two turns. The opposite ends of the coil 30 are connected to the mounting electrodes P1 and P2, respectively. In addition, the coil 30 has a winding axis in the Z-axis direction.

It is to be noted that, in FIG. 3A, the positions of the conductor patterns 31 and 32 and the interlayer connection conductors V32 and V33 at a time of stacking the plurality of insulating base material layers 11, 12, 13, 14, and 15 are indicated by a dashed line.

As illustrated in FIG. 3A, the frame portion 1 and the island shaped portion 3, when viewed in the Z-axis direction, are not overlapped with the conductor patterns 31 and 32. In addition, the conductor patterns 31 and 32, when viewed in the Z-axis direction, are wound around the island shaped portion 3, and are provided in a region overlapped with the opening portion 2. In addition, the interlayer connection conductors V32 and V33, when viewed in the Z-axis direction, are provided at positions overlapped with the opening portion 2. On the other hand, a portion of the connection portions 4, when viewed in the Z-axis direction, is overlapped with the conductor patterns 31 and 32.

In addition, as illustrated in FIG. 3B, the geometric gravity center G1 of the island shaped portion 3, when viewed in the Z-axis direction, is positioned in a maximum region GE surrounded by a straight line connecting the four boundaries BL1, BL2, BL3, and BL4 (a portion) between the two connection portions 4 and the frame portion 1.

The first preferred embodiment provides the following effects.

In the multilayer substrate 101 according to the first preferred embodiment, the frame portion 1 and the island shaped portion 3, when viewed in the Z-axis direction, are not overlapped with the conductor patterns 31 and 32 and the like, and the conductor patterns 31 and 32, when viewed in the Z-axis direction, are wounded around the island shaped portion 3, and are provided in the region overlapped with the opening portion 2. In other words, an area in which the opening portion 2 is overlapped with the conductor patterns 31 and 32 and the like, when viewed in the Z-axis direction, is larger than an area in which the frame portion 1 and the island shaped portion 3 are overlapped with the conductor patterns 31 and 32 and the like. With this configuration, since the plurality of insulating base material layers 11, 12, 13, 14, and 15 are stacked so that at least a portion of the conductor patterns 31 and 32 may be overlapped with the opening portion 2, the flatness of the multilayer substrate is ensured.

It is to be noted that, while the first preferred embodiment describes the multilayer substrate 101 in which the frame portion 1 and the island shaped portion 3, when viewed in the Z-axis direction, are not overlapped with the conductor patterns 31 and 32 and the like, a portion of the conductor patterns, when viewed in the Z-axis direction, may be overlapped with other portions (the frame portion 1 or the island shaped portion 3) of the thickness adjustment base material layer. In other words, the whole of the conductor patterns, when viewed in the Z-axis direction, may not be necessarily located (overlapped with) in the opening portion 2. However, in such a case, the area in which the opening portion 2 is overlapped with the conductor patterns when viewed in the Z-axis direction is conditioned to be larger than the area in which the opening portion 2 is overlapped with the frame portion 1 or the island shaped portion 3 when viewed in the Z-axis direction. With this configuration, as described above, the flatness of a multilayer substrate is ensured.

It is to be noted that, as in the first preferred embodiment, when viewed in the Z-axis direction, by the configuration in which the conductor patterns 31 and 32 are located (overlapped with) in the opening portion 2, in comparison with a case in which the whole of the conductor patterns 31 and 32 is overlapped with the opening portion 2, a multilayer substrate of which the flatness is further ensured is able to be obtained.

In addition, in the first preferred embodiment, the island shaped portion 3 is connected to the frame portion 1 through a plurality of connection portions 4. According to this configuration, in comparison with a case in which the island shaped portion 3 is connected to the frame portion 1 through a single connection portion 4, the island shaped portion 3 is stably fixed to the frame portion 1. Therefore, the deformation or positional displacement of the island shaped portion 3 when a plurality of insulating base material layers are stacked is significantly reduced or prevented.

In addition, in the first preferred embodiment, the geometric gravity center G1 of the island shaped portion 3, when viewed in the Z-axis direction, is positioned in a maximum region GE surrounded by a straight line connecting the four boundaries BL1, BL2, BL3, and BL4 between the two connection portions 4 and the frame portion 1. With this configuration, since the geometric gravity center G1 of the island shaped portion 3 is able to be fixed on a straight line by the plurality of connection portions 4, the island shaped portion 3 is more stably fixed to the frame portion 1. Therefore, according to this configuration, the thickness adjustment base material layer is further significantly reduced or prevented from deforming when the plurality of insulating base material layers are stacked.

In the first preferred embodiment, the plurality of insulating base material layers 11, 12, 13, 14, and 15 are made of thermoplastic resin. According to this configuration, since the insulating base material layers (resin) flow during heating and pressing when the stacked body 10 is formed, irregularities that might occur on the surface of the multilayer substrate are significantly reduced or prevented.

As described in the first preferred embodiment, a conductor pattern may define a coil. It is to be noted that, when a conductor pattern defines a coil (such as a planar loop shaped or planar spiral shaped coil, for example), the conductor pattern may be disposed in a high density manner in a planar direction in many cases in order to ensure a predetermined inductance and a predetermined number of turns. In such a case, the thickness of the conductor pattern may be increased in many cases in order to reduce a conductor loss. Even with this configuration, the plurality of insulating base material layers are stacked such that the conductor pattern may be overlapped with the opening portion of the thickness adjustment base material layer, and thus the flatness of the multilayer substrate is ensured.

In addition, generally, in a case in which a coil having a winding axis in the stacking direction (the Z-axis direction) is provided, a conductor pattern is not disposed at the opening portion of the coil in many cases so as not to block the formation of a magnetic field, a thickness adjustment base material layer having an island shaped portion may be used in order to adjust the thickness of the opening portion of the coil. However, as described above, according to the first preferred embodiment, the deformation or positional displacement of the island shaped portion 3 when the plurality of insulating base material layers are stacked is significantly reduced or prevented.

Further, in a case in which a helical shaped coil with which a plurality of conductor patterns are overlapped in the stacking direction (Z-axis direction) is configured, while it is important to ensure the flatness of a multilayer substrate by a thickness adjustment base material layer, in particular, since the plurality of conductor patterns are disposed in a high density manner in the stacking direction, the configuration of the present invention is able to provide significant effects.

In the first preferred embodiment, the line width (the width in the Y-axis direction) of the connection portions 4 is smaller than the width (the width in the Y-axis direction) of the island shaped portion 3. In this configuration, when viewed in the Z-axis direction, an area in which the connection portions 4 are overlapped with the conductor patterns 31 and 32 and the like is small. Therefore, even when a portion of the connection portions 4, when viewed in the Z-axis direction, is overlapped with the conductor patterns 31 and 32, the insulating base material layers (resin) flow during heating and pressing when the stacked body 10 is formed, irregularities do not easily occur on the surface of the multilayer substrate. In other words, while it is preferable to make the line width of the connection portions 4 small in that the flatness of a multilayer substrate is ensured, as described above, the geometric gravity center G1 of the island shaped portion 3 is preferably positioned in the maximum region GE surrounded by a straight line connecting the plurality of boundaries BL1, BL2, BL3, and BL4 between the plurality of connection portions 4 and the frame portion 1.

Additionally, in the first preferred embodiment, the interlayer connection conductor V32 and V33 and the like, when viewed in the Z-axis direction, are overlapped with the opening portion 2. According to this configuration, since the interlayer connection conductor that is not easily contracted in the stacking direction (the Z-axis direction) during heating and pressing is located in a portion (the opening portion 2) in which an insulating base material layer is not located, the flatness of the multilayer substrate is able to be improved.

Figure 4:
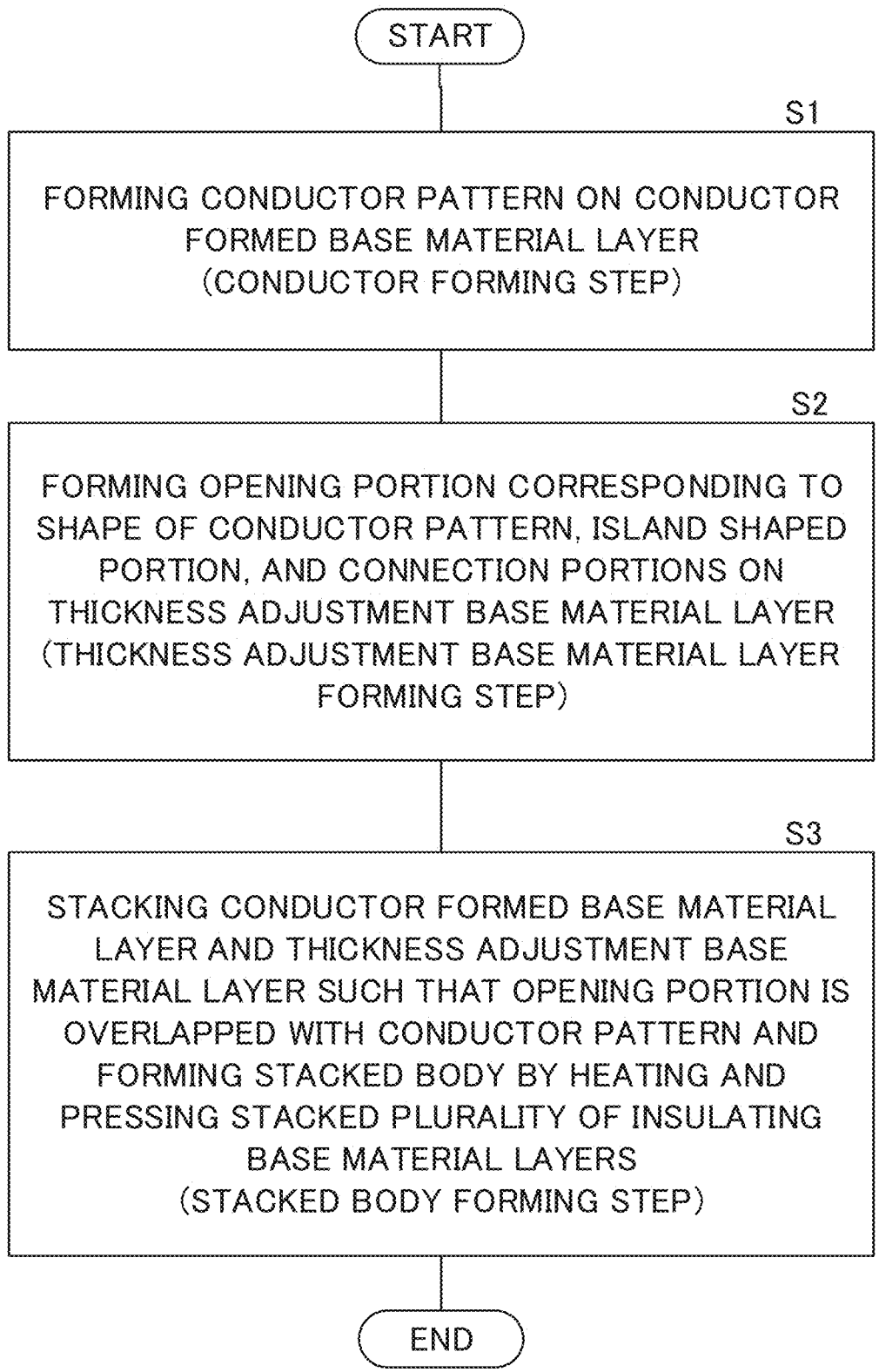
FIG. 4 is a flow chart of a method of manufacturing the multilayer substrate 101 according to the first preferred embodiment of the present invention.

The multilayer substrate 101 according to the first preferred embodiment is manufactured by, for example, the following manufacturing method. FIG. 4 is a flow chart of a method of manufacturing the multilayer substrate 101 according to the first preferred embodiment of the present invention.

First, the conductor patterns 31, 32, and 33 are formed on the front surface of the insulating base material layers (the conductor containing base material layers) 12 and 14 made of thermoplastic resin (S1). Specifically, a metal foil (a Cu foil, for example) is laminated on one principal surface of the insulating base material layers 12 and 14, and then the metal foil is patterned by photolithography, so that the conductor patterns 31, 32, and 33 are individually formed.

This step of forming a conductor pattern on an insulating base material layer and configuring a conductor containing base material layer is an example of a "conductor forming step" in a preferred embodiment of the present invention.

Next, the opening portion 2 (a through hole), the island shaped portion 3, and the plurality of connection portions 4 are formed on the insulating base material layer 13 (the thickness adjustment base material layer) made of thermoplastic resin (S2). The opening portion 2 is a through hole having a shape corresponding to the shape of the conductor patterns 31, 32, and 33, and the island shaped portion 3 is an island-shape portion disposed inside of the opening portion 2. The plurality of connection portions 4 are portions connecting the island shaped portion 3 to the frame portion 1 of the insulating base material layer 13. Specifically, a portion of the opening portion 2, other than the island shaped portion 3 and the connection portions 4, is etched by laser and the like to form the frame portion 1, the opening portion 2, the island shaped portion 3, and the plurality of connection portions 4. Alternatively, a portion of the opening portion 2, other than the island shaped portion 3 and the connection portions 4, may be punched out by punching or the like.

This step of forming a frame portion, an opening portion having a shape corresponding to the shape of a conductor pattern, an island shaped portion disposed inside of the opening portion, and a plurality of connection portions connecting the island shaped portion to the frame portion 1, on an insulating base material layer and configuring a thickness adjustment base material layer is an example of a "thickness adjustment base material layer forming step".

Subsequently, when viewed in the Z-axis direction, a plurality of insulating base material layers 11, 12, 13, 14, and 15 are stacked such that the opening portion 2 is overlapped with the conductor patterns 31, 32, and 33, and the plurality of insulating base material layers 11, 12, 13, 14, and 15 are heated and pressed to form a stacked body 10 (S3).

This step of forming a stacked body by stacking the conductor containing base material layer and the thickness adjustment base material layer such that the opening portion is overlapped with the conductor pattern and by heating and pressing the stacked plurality of insulating base material layers is an example of a "stacked body forming step".

After the above described steps, a collective substrate is divided to an individual piece to obtain a multilayer substrate 101.

According to this manufacturing method, when a plurality of insulating base material layers including a thickness adjustment base material layer are stacked, the deformation or the like of each component is significantly reduced or prevented, so that it becomes easy to stack the plurality of insulating base material layers and it is possible to easily manufacture a multilayer substrate with a flatness that is easily ensured.

It is to be noted that, while, in the above described manufacturing method, an example in which the "thickness adjustment base material layer forming step" is performed after the "conductor forming step" is described, the present invention is not limited to this configuration. As long as being performed before the "stacked body forming step," the "conductor forming step" may be performed after the "thickness adjustment base material layer forming step."

Additionally, while, in the foregoing description, a method of manufacturing the mounting electrodes P1 and P2 is not described, the mounting electrodes P1 and P2 are formed on the rear surface of the insulating base material layer 15 made of thermoplastic resin in a step roughly similar to the "conductor forming step" before Step S3. Further, the mounting electrodes P1 and P2 may be formed on the first principal surface VS1 of the stacked body 10 after the "stacked body forming step."

While, in the above-stated description, a method of manufacturing the interlayer connection conductors V31, V32, V33, and V34 is not described, roughly, after a through hole is provided in the interlayer connection conductor by laser or the like, the interlayer connection conductors V31, V32, V33, and V34 may be formed by filling conductive paste into the through hole of each of the interlayer connection conductors. Subsequently, the above described Step S3 may be performed. The interlayer connection conductor is obtained by curing by heating and pressing of the "stacked body forming step."

Figure 5A:
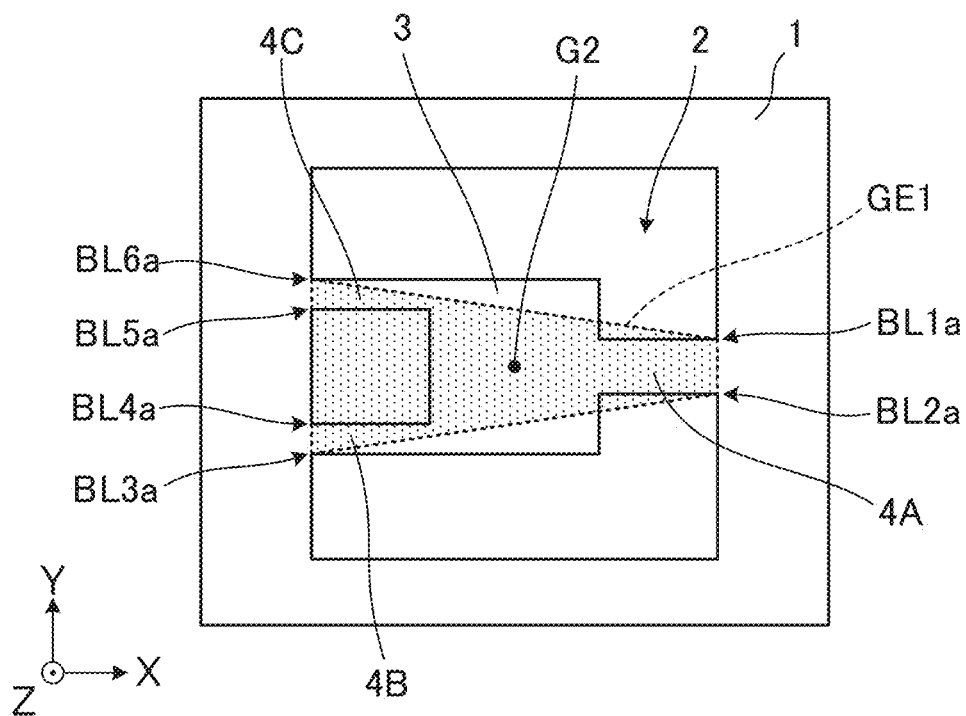
FIG. 5A is a plan view of an insulating base material layer 13a, illustrating a positional relationship between a geometric gravity center G2 of the island shaped portion 3, and three connection portions 4A, 4B, and 4C.
Figure 5B:
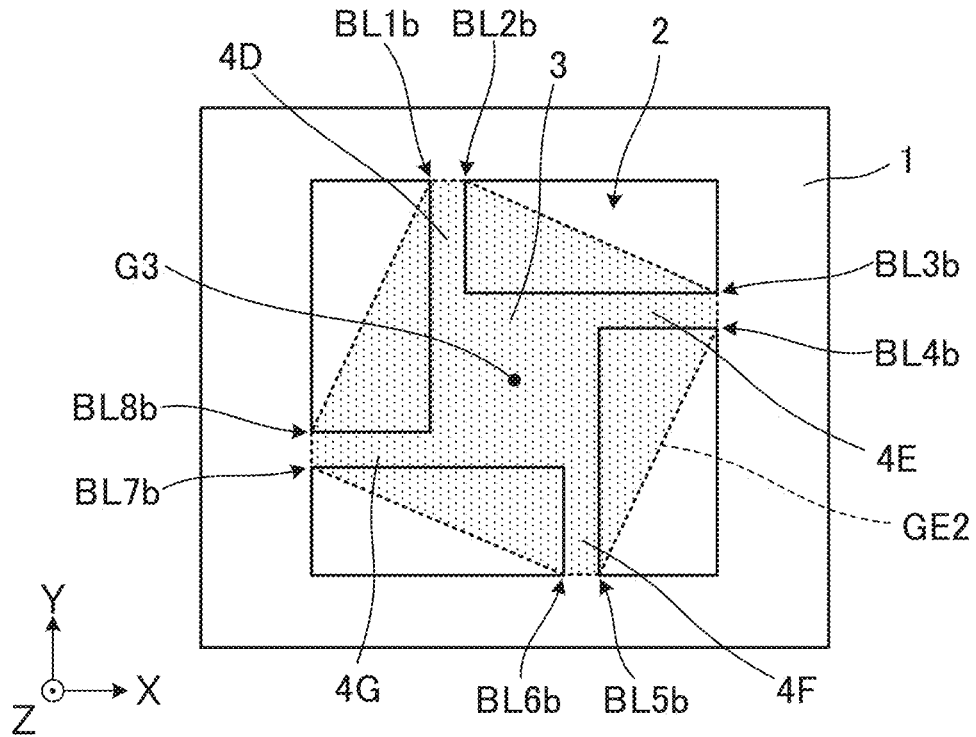
FIG. 5B is a plan view of an insulating base material layer 13b, illustrating a positional relationship between a geometric gravity center G3 of the island shaped portion 3, and four connection portions 4D, 4E, 4F, and 4G.

Subsequently, a case in which one island shaped portion is connected to a frame portion through three or more connection portions will be described with reference to the drawings. FIG. 5A is a plan view of an insulating base material layer 13a, illustrating a positional relationship between a geometric gravity center G2 of the island shaped portion 3, and three connection portions 4A, 4B, and 4C, and FIG. 5B is a plan view of an insulating base material layer 13b, illustrating a positional relationship between a geometric gravity center G3 of the island shaped portion 3, and four connection portions 4D, 4E, 4F, and 4G. In FIGS. 5A and 5B, maximum regions GE1 and GE2 are indicated by dot patterns.

The insulating base material layer 13a, as illustrated in FIG. 5A, includes a frame portion 1, an opening portion 2, an island shaped portion 3, and three connection portions 4A, 4B, and 4C. The insulating base material layer 13a is different in the configuration of the connection portion from the insulating base material layer 13, and other configurations are substantially the same as the configurations of the insulating base material layer 13.

The three connection portions 4A, 4B, and 4C are linear portions each extending in the X-axis direction. The island shaped portion 3 is connected to the frame portion 1 through the three connection portions 4A, 4B, and 4C. In addition, as illustrated in FIG. 5A, the line width (the width in the Y-axis direction) of the connection portions 4A, 4B, and 4C is smaller than the width (the width in the Y-axis direction) of the island shaped portion 3. It is to be noted that the line width of the connection portion 4A is larger than the line width of the connection portions 4B and 4C.

As illustrated in FIG. 5A, the geometric gravity center G2 of the island shaped portion 3, when viewed in the Z-axis direction, is positioned in a maximum region GE1 surrounded by a straight line connecting six boundaries BL1a, BL2a, BL3a, BL4a, BL5a, and BL6a between the three connection portions 4A, 4B, and 4C and the frame portion 1. It is to be noted that, as illustrated in FIG. 5A, the line widths of the plurality of connection portions may not be the same.

The insulating base material layer 13b, as illustrated in FIG. 5B, includes a frame portion 1, an opening portion 2, an island shaped portion 3, and four connection portions 4D, 4E, 4F, and 4G. The insulating base material layer 13b is different in the configuration of the connection portion from the insulating base material layer 13, and other configurations are the same or substantially the same as the configurations of the insulating base material layer 13.

The connection portions 4D and 4F are linear portions each extending in the Y-axis direction, and the connection portions 4E and 4G are linear portions each extending in the X-axis direction. The island shaped portion 3 is connected to the frame portion 1 through the four connection portions 4D, 4E, 4F, and 4G.

As illustrated in FIG. 5B, the geometric gravity center G3 of the island shaped portion 3, when viewed in the Z-axis direction, is positioned in a maximum region GE2 surrounded by a straight line connecting boundaries BL1b, BL2b, BL3b, BL4b, BL5b, BL6b, BL7b, and BL8b between the four connection portions 4D, 4E, 4F, and 4G and the frame portion 1.

As described above, even when one island shaped portion is connected to the frame portion 1 through three or more connection portions, as long as, when viewed in the Z-axis direction, the geometric gravity center of the island shaped portion 3 is positioned in a maximum region surrounded by a straight line connecting a plurality of boundaries between each connection portion and the frame portion 1, the island shaped portion 3 is stably fixed to the frame portion 1.

Second Preferred Embodiment

In a second preferred embodiment of the present invention, a description will be given of an example of a multilayer substrate including a plurality of thickness adjustment base material layers.

Figure 6:
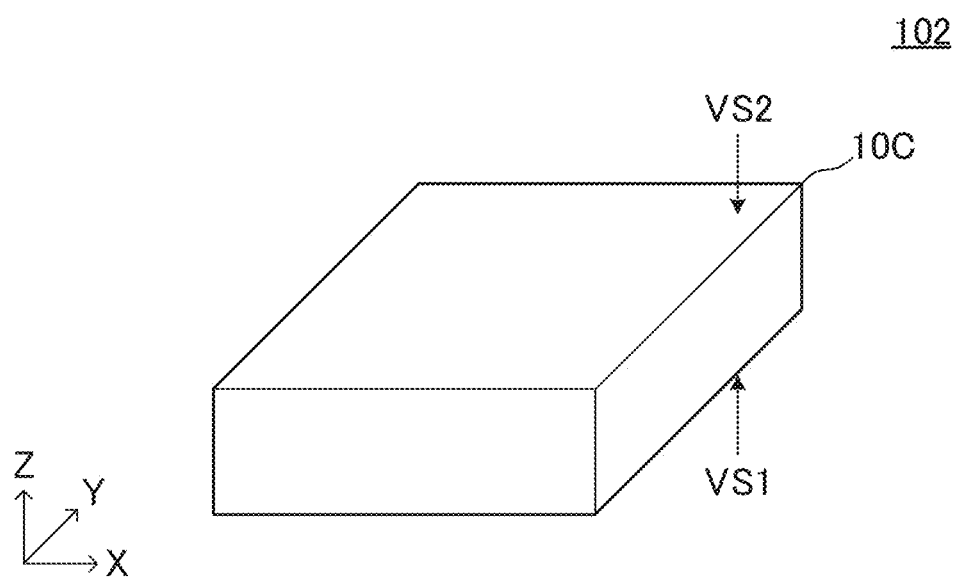
FIG. 6 is a perspective view of a multilayer substrate 102 according to a second preferred embodiment of the present invention.
Figure 7:
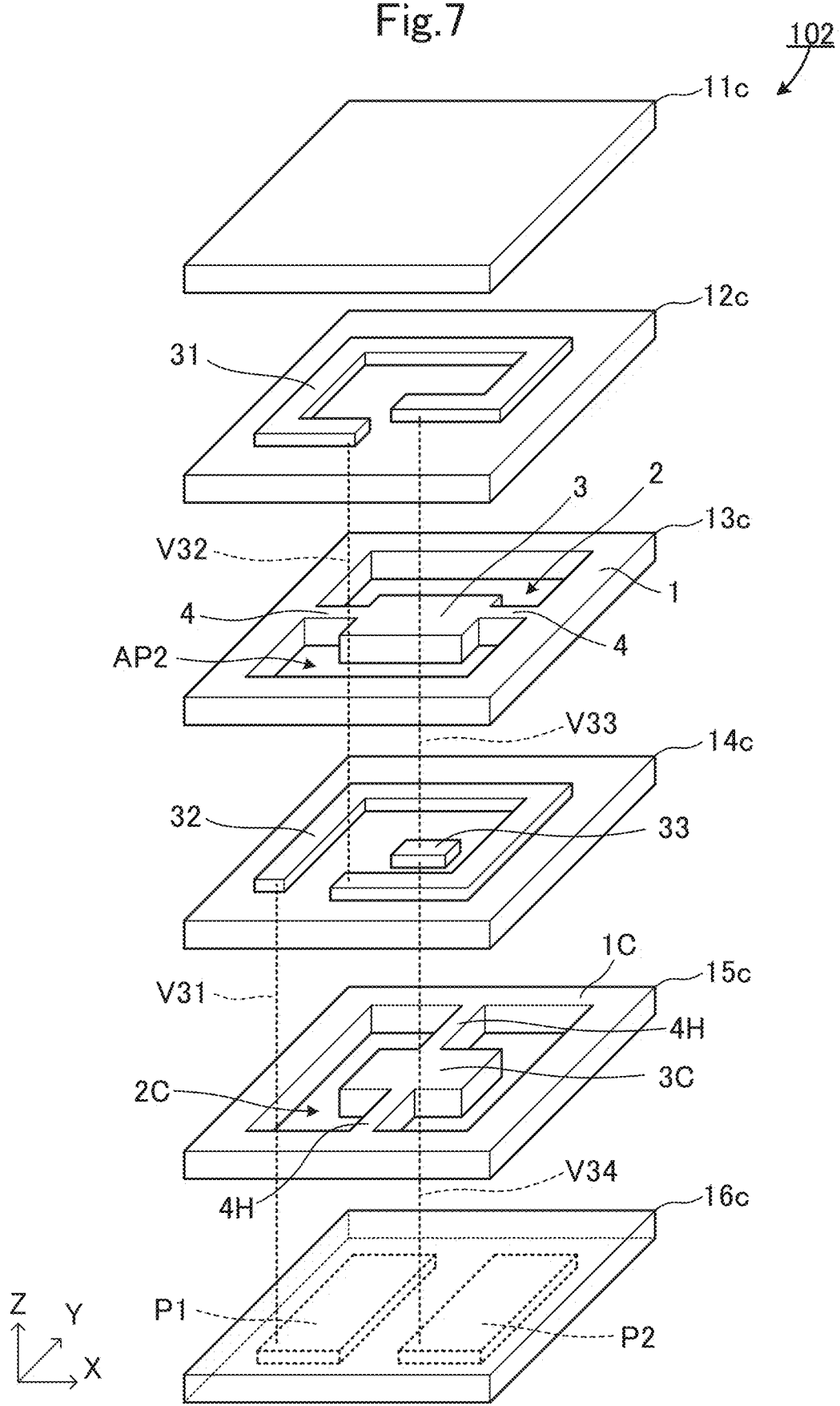
FIG. 7 is an exploded perspective view of the multilayer substrate 102 according to the second preferred embodiment of the present invention.
Figure 8A:
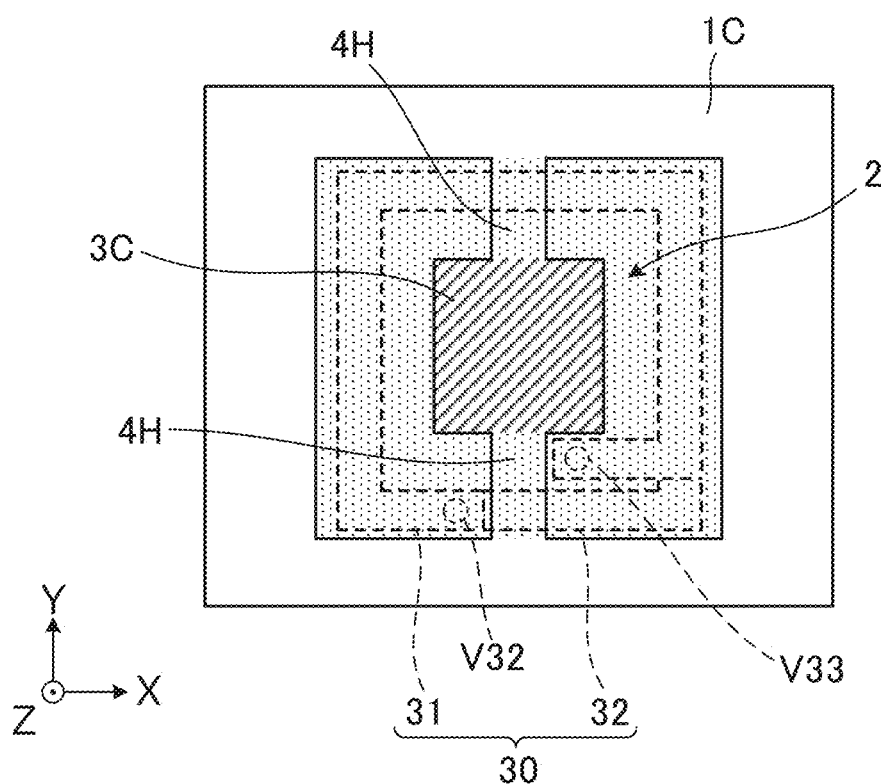
FIG. 8A is a plan view of an insulating base material layer 15c, illustrating a frame portion 1C, an opening portion 2C, an island shaped portion 3C, and a connection portion 4H.
Figure 8B:
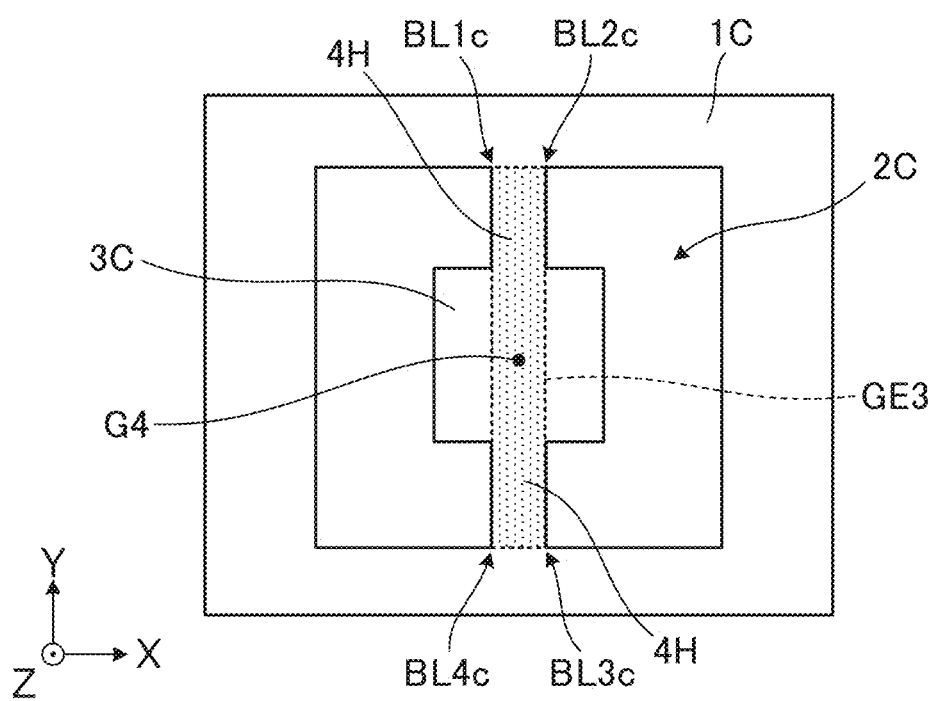
FIG. 8B is a plan view of the insulating base material layer 15c, illustrating a positional relationship between a geometric gravity center G4 of the island shaped portion 3C, and the connection portion 4H.

FIG. 6 is a perspective view of a multilayer substrate 102 according to the second preferred embodiment of the present invention. FIG. 7 is an exploded perspective view of the multilayer substrate 102 according to the second preferred embodiment of the present invention. FIG. 8A is a plan view of an insulating base material layer 15c, illustrating a frame portion 1C, an opening portion 2C, an island shaped portion 3C, and a connection portion 4H, and FIG. 8B is a plan view of the insulating base material layer 15c, illustrating a positional relationship between a geometric gravity center G4 of the island shaped portion 3C, and the connection portion 4H. In FIG. 8A, in order to make the structure more understandable, the opening portion 2C is indicated by a dot pattern and the island shaped portion 3C is indicated by hatching. In addition, in FIG. 8B, a maximum region GE3 is indicated by a dot pattern.

The multilayer substrate 102 is different from the multilayer substrate 101 according to the first preferred embodiment in that two thickness adjustment base material layers are provided. Other configurations are the same or substantially the same as the configurations of the multilayer substrate 101. Hereinafter, a description will be given of a portion that is different from the multilayer substrate 101 according to the first preferred embodiment of the present invention.

The multilayer substrate 102 includes a stacked body 10C formed by stacking a plurality of insulating base material layers 11c, 12c, 13c, 14c, 15c, and 16c, and conductor patterns 31, 32, and 33 that are provided on the insulating base material layers 12c and 14c.

The stacked body 10C has a rectangular or substantially rectangular parallelepiped shape and is made of thermoplastic resin, for example, and includes a first principal surface VS1 and a second principal surface VS2 that faces the first principal surface VS1. In the second preferred embodiment, each of the insulating base material layers 12c and 14c is the "conductor containing base material layer," and each of the insulating base material layers 13c and 15c is the "thickness adjustment base material layer."

The configuration of the insulating base material layers 11c, 12c, 13c, and 14c is the same or substantially the same as the configuration of the insulating base material layers 11, 12, 13, and 14 described in the first preferred embodiment of the present invention.

The insulating base material layer 15c, as illustrated in FIG. 8B, includes a frame portion 1C, an opening portion 2C, an island shaped portion 3C, and two connection portions 4H. The frame portion 1C is a frame shaped portion obtained by removing the opening portion 2C from the insulating base material layer 15c, and includes or defines the outer periphery of the insulating base material layer 15c. The opening portion 2C is a through hole provided inside of the frame portion 1C and having a rectangular or substantially rectangular planar shape. When the plurality of insulating base material layers 11c 12c, 13c, 14c, 15c, and 16c are stacked, the opening portion 2C, when viewed in the Z-axis direction, is provided so as to include a position overlapped with the conductor patterns 31, 32, and 33. The island shaped portion 3C is a rectangular or substantially rectangular shaped island-shaped portion disposed at the center of the inside (the inside of the opening portion 2C) of the frame portion 1C. The two connection portions 4H are linear portions extending in the Y-axis direction. The island shaped portion 3C is connected to the frame portion 1C through the two connection portions 4H. In addition, as illustrated in FIG. 8B, the line width (the width in the X-axis direction) of the connection portions 4H is smaller than the width (the width in the X-axis direction) of the island shaped portion 3C.

Two mounting electrodes P1 and P2 are provided on the rear surface of the insulating base material 16c. The mounting electrodes P1 and P2 are conductors having a rectangular or substantially rectangular shape of which the longitudinal direction coincides with the Y-axis direction. The mounting electrodes P1 and P2 according to the second preferred embodiment are respectively disposed in the vicinity of the first side (the left side of the insulating base material layer 16c in FIG. 7) of the insulating base material layer 16c and in the vicinity of the second side (the right side of the insulating base material layer 16c) of the insulating base material layer 16c.

As illustrated in FIG. 7, the mounting electrode P1 is connected to the first end of the conductor pattern 32 through the interlayer connection conductor V31 respectively provided on the insulating base material layers 14c and 16c. The second end of the conductor pattern 32 is connected to the first end of the conductor pattern 31 through an interlayer connection conductor V32 provided on the insulating base material layer 12c. The second end of the conductor pattern 31 is connected to the conductor pattern 33 through an interlayer connection conductor V33 provided on the insulating base material layer 12c. The conductor pattern 33 is connected to the mounting electrode P2 through an interlayer connection conductor V34 provided on the insulating base material layers 14c and 16c.

As described above, in the multilayer substrate 102, the conductor patterns 31, 32, and 33 that are each provided on the plurality of insulating base material layers 12c and 14c, and the interlayer connection conductors V32 and V33 define a coil 30 having a rectangular or substantially rectangular helical shape including about two turns.

In addition, in FIG. 8A, the positions of the conductor patterns 31 and 32 and the interlayer connection conductors V32 and V33 at a time of stacking the plurality of insulating base material layers 11c, 12c, 13c, 14c, 15c, and 16c are indicated by a dashed line. As illustrated in FIG. 8A, the conductor patterns 31 and 32, when viewed in the Z-axis direction, are wound around the island shaped portion 3C, and are provided in a region overlapped with the opening portion 2C. Further, the interlayer connection conductors V32 and V33, when viewed in the Z-axis direction, are provided at positions overlapped with the opening portion 2C.

As illustrated in FIG. 8B, the geometric gravity center G4 of the island shaped portion 3C, when viewed in the Z-axis direction, is positioned in a maximum region GE3 surrounded by a straight line connecting the four boundaries BL1c, BL2c, BL3c, and BL4c between the two connection portions 4H and the frame portion 1C.

Further, as illustrated in FIG. 7 and other drawings, the connection portions 4 and 4H respectively provided on the thickness adjustment base material layer (the insulating base material layers 13c and 15c), when viewed in the Z-axis direction, are disposed at the positions at which the connection portions are not overlapped with each other.

According to the multilayer substrate 102 of the second preferred embodiment of the present invention, the following advantageous effects in addition to the advantageous effects described in the first preferred embodiment are obtained.

In the multilayer substrate 102, the connection portions 4 and 4H respectively provided on the different insulating base material layers 13c and 15c, when viewed in the Z-axis direction, are disposed at the positions at which the connection portions are not overlapped with each other. According to this configuration, when viewed in the Z-axis direction, in comparison with a case in which the connection portions 4 and 4H respectively provided on the different insulating base material layers 13c and 15c are overlapped with each other, irregularities that might occur on the surface of the multilayer substrate with this configuration are significantly reduced or prevented, which improves the flatness of the multilayer substrate.

It is to be noted that, as described in the second preferred embodiment, in a case in which the thickness adjustment base material layer (the insulating base material layers 13c and 15c) includes a plurality of thickness adjustment base material layers, even when a thickness (a thickness in the Z-axis direction) per a layer of the thickness adjustment base material layers is reduced, irregularities that might occur on the surface of the multilayer substrate are significantly reduced or prevented. In addition, a plurality of thickness adjustment base material layers having a small thickness per layer are provided, in comparison with a case in which one thickness adjustment base material layer having a large thickness is provided, the amount of the insulating base material layers flowing into the opening portion of the layer of the plurality of thickness adjustment base material layers when being stacked is reduced (dispersed). Accordingly, the deformation and positional displacement of the conductor pattern caused by the insulating base material layers flowing into the opening portion are significantly reduced or prevented, and a characteristic change caused by the deformation and positional displacement of the conductor pattern may be also difficult to occur.

It is to be noted that the number of thickness adjustment base material layers may preferably be the same as the number of conductor containing base material layers, and that the thickness adjustment base material layer may preferably include an opening portion having a shape corresponding to the shape of the conductor pattern provided on the conductor containing base material layer. In other words, in the case in which the conductor containing base material layer includes a plurality of conductor containing base material layers, the number of thickness adjustment base material layers may preferably be the same as the number of conductor containing base material layers, and each of the thickness adjustment base material layers may preferably include an opening having a shape corresponding to the shape of each of the conductor patterns provided on the plurality of conductor containing base material layers.

In addition, in the case in which the thickness adjustment base material layer includes a plurality of thickness adjustment base material layers, the shapes of the island shaped portions 3 and 3C of different thickness adjustment base material layers may be different.

Third Preferred Embodiment

In a third preferred embodiment of the present invention, a description will be given of an example in which a dummy conductor is provided on a thickness adjustment base material layer.

Figure 9A:
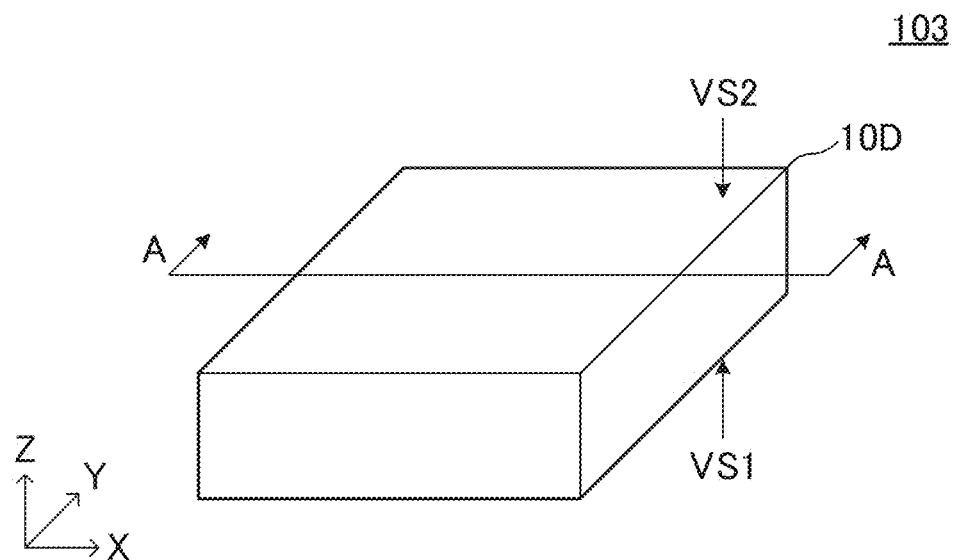
FIG. 9A is a perspective view of a multilayer substrate 103 according to a third preferred embodiment of the present invention, and each of FIGS. 9B and 9C is an A-A cross-sectional view in FIG. 9A.
Figure 9B:
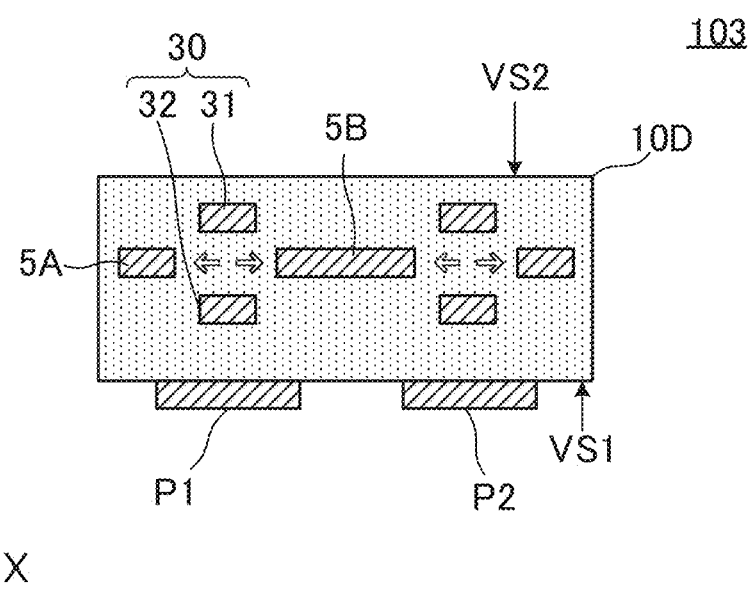
Figure 10:
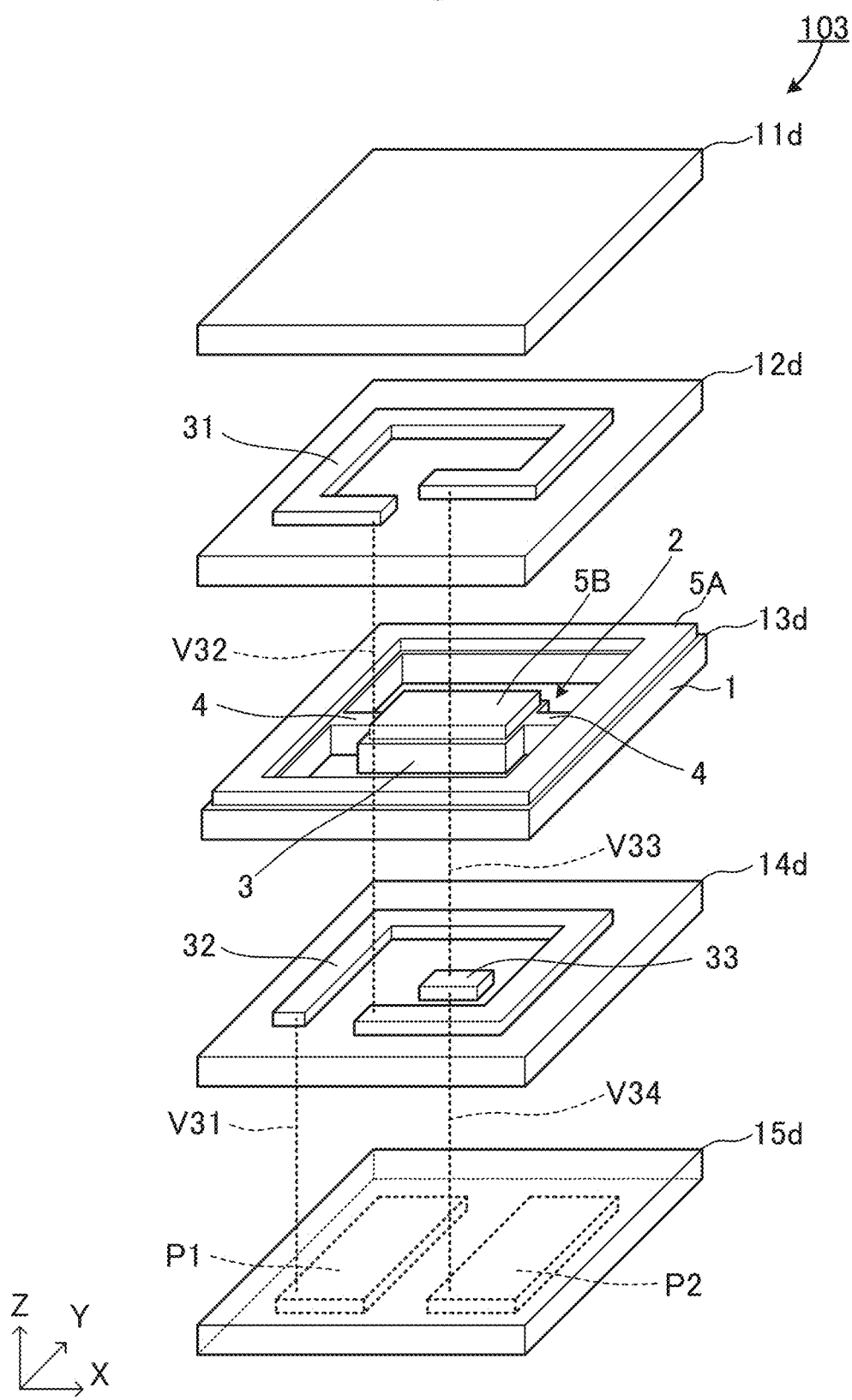
FIG. 10 is an exploded perspective view of the multilayer substrate 103 according to the third preferred embodiment of the present invention.
Figure 11:
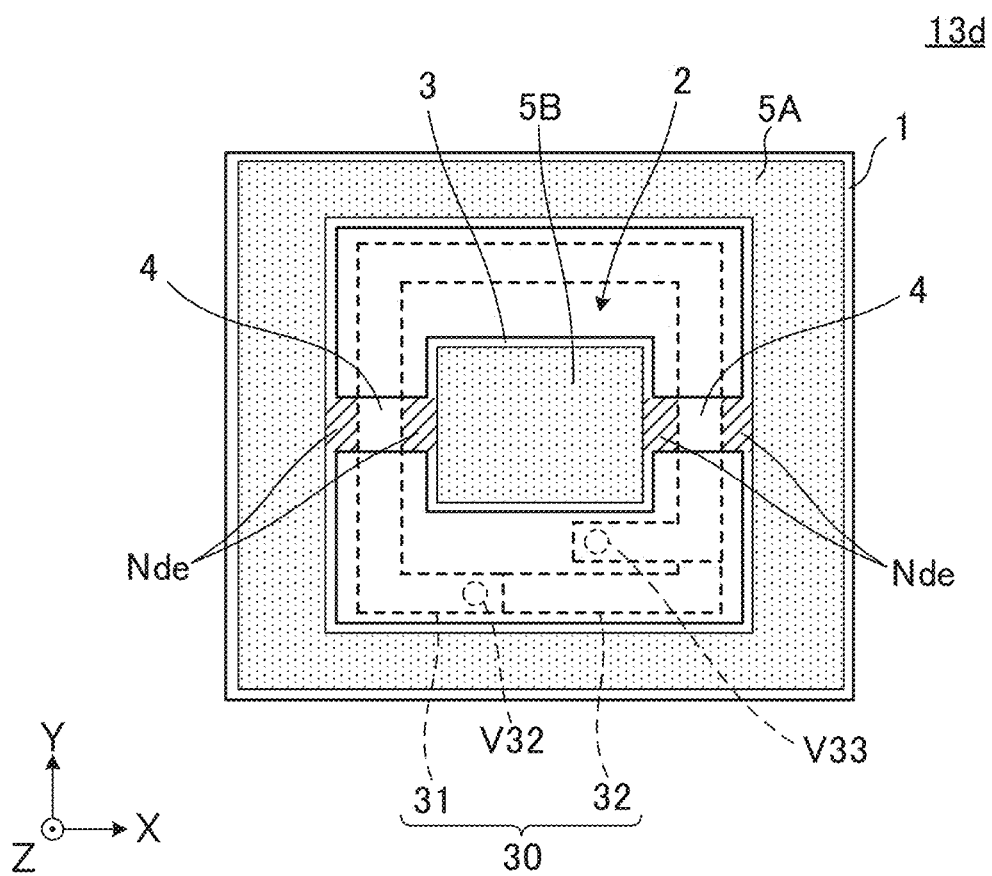
FIG. 11 is a plan view of an insulating base material layer 13d.

FIG. 9A is a perspective view of a multilayer substrate 103 according to the third preferred embodiment of the present invention, and FIG. 9B is an A-A cross-sectional view in FIG. 9A. FIG. 10 is an exploded perspective view of the multilayer substrate 103 according to the third preferred embodiment of the present invention. FIG. 11 is a plan view of an insulating base material layer 13d. In FIG. 11, in order to make the structure more understandable, dummy conductors 5A and 5B are indicated by dot patterns. In addition, in FIG. 11, of the insulating base material layer 13d, when viewed in the Z-axis direction, a region Nde adjacent to a portion overlapped with the conductor pattern 31 is indicated by hatching.

The multilayer substrate 103 is different from the multilayer substrate 101 according to the first preferred embodiment in that a dummy conductor is provided on a thickness adjustment base material layer. Other configurations are the same or substantially the same as the configurations of the multilayer substrate 101. Hereinafter, a description will be given of a portion that is different from the multilayer substrate 101 according to the first preferred embodiment of the present invention.

The multilayer substrate 103 includes a stacked body 10D formed by stacking a plurality of insulating base material layers 11d, 12d, 13d, 14d, and 15d. In the third preferred embodiment, each of the insulating base material layers 12d and 14d is the "conductor containing base material layer," and the insulating base material layers 13d is the "thickness adjustment base material layer." The configuration of the insulating base material layers 11d, 12d, 14d, and 15d is the same or substantially the same as the configuration of the insulating base material layers 11, 12, 14, and 15 described in the first preferred embodiment of the present invention.

The configuration of the insulating base material layer 13d is the same or substantially the same as the configuration of the insulating base material layer 13 described in the first preferred embodiment of the present invention. Dummy conductors 5A and 5B are provided on the surface of the insulating base material layer 13d. The dummy conductor 5A is an annular or substantially annular conductor pattern having substantially the same shape as the shape of the frame portion 1. The dummy conductor 5B is a rectangular or substantially rectangular conductor pattern having substantially the same shape as the shape of the island shaped portion 3. The dummy conductors 5A and 5B are conductor patterns made of a material such as a Cu foil, for example.

It is to be noted that the dummy conductor is not provided at the connection portion 4 of the insulating base material layer 13d. Specifically, of the insulating base material layer 13d, when viewed in the Z-axis direction, a dummy conductor is not provided in a region (an adjacent region Nde) adjacent to a portion overlapped with the conductor pattern 31.

Figure 9C:
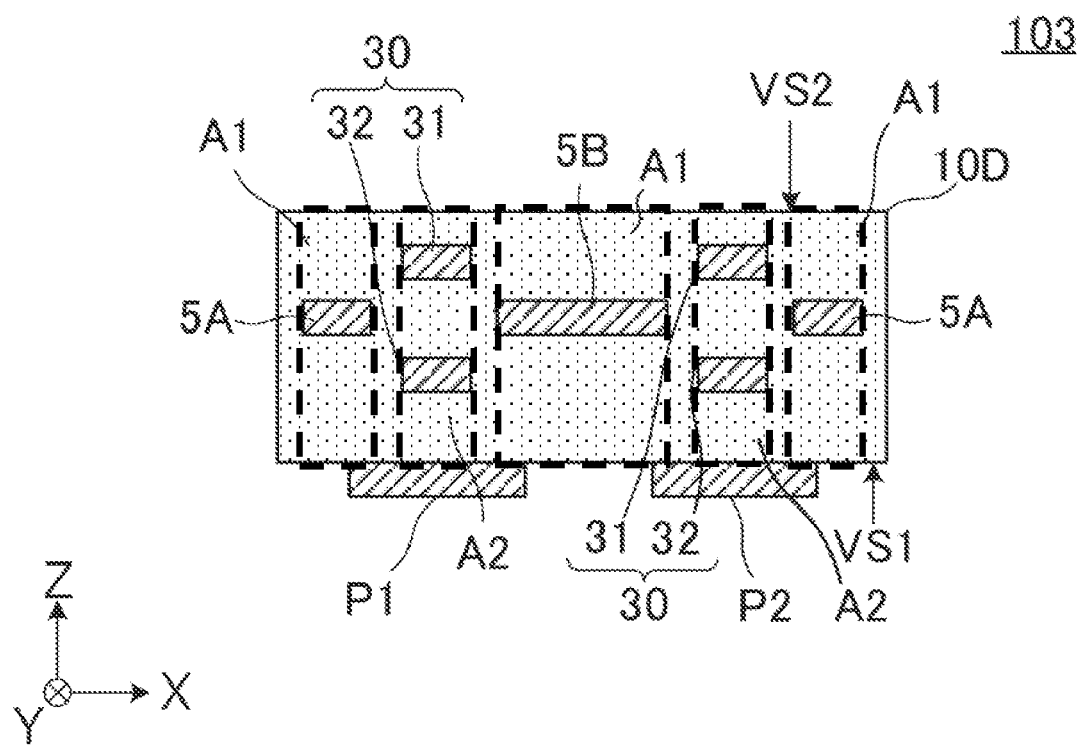

The dummy conductors 5A and 5B, as illustrated in FIG. 10, are not connected to the conductor patterns 31, 32, and 33 provided on the insulating base material layers 12d and 14d, and are electrically isolated from of the conductor patterns 31, 32, and 33. In addition, the dummy conductors 5A and 5B, as illustrated in FIG. 11, when viewed in the Z-axis direction, are disposed at positions that are not overlapped with the conductor patterns 31, 32, and 33. Thus as illustrated in FIGS. 9C and 11, when viewed in the Z-axis direction, the dummy conductors 5A and 5B are disposed in a first area A1, and the conductor patterns 31, 32, and 33 are disposed in a second area A2 where the dummy conductors 5A and 5B are not disposed.

According to the multilayer substrate 103 of the third preferred embodiment of the present invention, the following advantageous effects in addition to the advantageous effects that have been described in the first preferred embodiment may be obtained.

In the third preferred embodiment, the dummy conductors 5A and 5B are provided on the insulating base material layer (the thickness adjustment base material layer) 13d. According to this configuration, the thickness of the multilayer substrate is able to be adjusted using the dummy conductors 5A and 5B, and a range in which the thickness of the multilayer substrate is adjusted is able to be increased.

In the third preferred embodiment, when viewed in the Z-axis direction, since the dummy conductors 5A and 5B are disposed so as to interpose the conductor patterns 31 and 32, non-uniform flow of the insulating base material layers (resin) during heating and pressing when the stacked body 10D is formed is significantly reduced or prevented. Accordingly, the deformation or positional displacement of the conductor patterns 31 and 32 due to the flow of the insulating base material layers during heating and pressing is significantly reduced or prevented. In particular, in a case in which a coil 30 is defined by the conductor patterns 31 and 32 as in the third preferred embodiment, the shape of the coil 30 after being heated and pressed is stabilized, so that a coil with significantly reduced variations (changes in interlayer capacitance and changes in coil characteristics) in electrical characteristics and significantly increased electric reliability is able to be provided.

In addition, in the third preferred embodiment, the dummy conductors 5A and 5B are provided on the insulating base material layer 13d different from the insulating base material layers 12d and 14d on which the conductor patterns 31 and 32 are provided. According to this configuration, in comparison with a case in which a dummy conductor is provided on the insulating base material layers 12d and 14d on which the conductor patterns 31 and 32 are provided, contact between the dummy conductors 5A and 5B and the conductor patterns 31 and 32 does not easily occur. In addition, according to this configuration, when viewed in the Z-axis direction, the dummy conductors 5A and 5B and the conductor patterns 31 and 32 are able to be disposed adjacent to each other, so that the non-uniform flow of the insulating base material layer during heating and pressing is able to be further significantly reduced or prevented.

In the third preferred embodiment, when viewed in the Z-axis direction, a dummy conductor is not provided at the connection portion 4 overlapped with the conductor pattern 31. Therefore, since the insulating base material layers (resin) of a portion overlapped with the conductor pattern 31 are easy to flow during heating and pressing when the stacked body 10D is formed, irregularities do not easily occur on the surface of the multilayer substrate.

Further, in the third preferred embodiment, when viewed in the Z-axis direction, of the insulating base material layer 13d, a dummy conductor is not provided in the adjacent region Nde of a portion overlapped with the conductor pattern 31. According to this configuration, the insulating base material layers (resin) of the portion overlapped with the conductor pattern 31 easily flow (see outline arrows in FIG. 9B) in the adjacent region of the portion overlapped with the conductor pattern 31 during heating and pressing, and, as a result, irregularities that might occur on the surface of the multilayer substrate are significantly reduced or prevented.

It is to be noted that, while the third preferred embodiment describes an example in which the dummy conductors 5A and 5B, when viewed in the Z-axis direction, are disposed at the positions that are not overlapped with the conductor patterns 31, 32, and 33, the dummy conductors 5A and 5B, when viewed in the Z-axis direction, may be overlapped with the conductor patterns 31, 32, and 33. However, the dummy conductors, when viewed in the Z-axis direction, may preferably be disposed at a position at which an overlap between the conductors is small. As a result, it becomes possible to easily reduce or prevent irregularities that might occur on the surface of the multilayer substrate.

In addition, while the third preferred embodiment describes an example in which one dummy conductor 5A is provided on the whole of the frame portion 1 and one dummy conductor 5B is provided on the whole of the island shaped portion 3, the present invention is not limited to this configuration. The dummy conductor may be partially provided on the surface of the thickness adjustment base material layer or a plurality of dummy conductors may be provided on the thickness adjustment base material layer. According to this configuration, since internal stress caused due to differences (such as a thermal expansion coefficient) in physical properties between the dummy conductor and the thickness adjustment base material layer is dispersed, the warpage of the stacked body caused by the internal stress, the separation of an insulating base material layer, or the like is significantly reduced or prevented.

Figure 12:
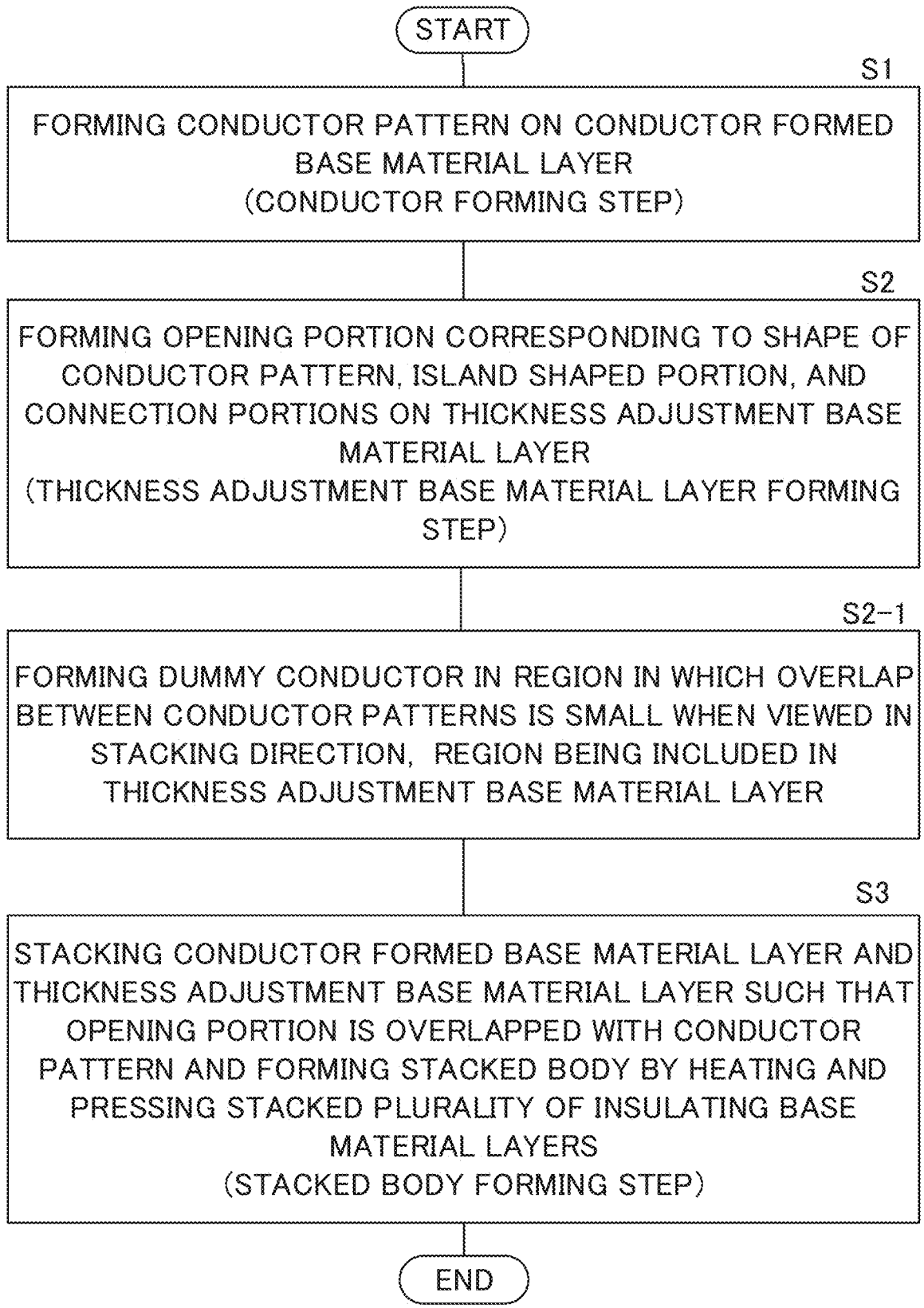
FIG. 12 is a flow chart of a method of manufacturing the multilayer substrate 103 according to the third preferred embodiment of the present invention.

The multilayer substrate 103 according to the third preferred embodiment is manufactured by, for example, the following manufacturing method. FIG. 12 is a flow chart of a method of manufacturing the multilayer substrate 103 according to the third preferred embodiment of the present invention.

First, the conductor patterns 31 and 32 are formed on the front surface of the insulating base material layers (the conductor containing base material layers) 12d and 14d made of thermoplastic resin (S1) (a conductor forming step).

Next, the opening portion 2, the island shaped portion 3, and the plurality of connection portions 4 are formed on the insulating base material layer (the thickness adjustment base material layer) 13d made of thermoplastic resin (S2) (a thickness adjustment base material layer forming step).

In addition, the dummy conductors 5A and 5B are formed on the surface of the insulating base material layer 13d. Specifically, the dummy conductors 5A and 5B are formed in a region of the insulating base material layer 13d, the region having a small overlap with the conductor patterns 31, 32, and 33 when the stacked plurality of insulating base material layers 11d, 12d, 13d, 14d, and 15d are viewed in the Z-axis direction (S2-1).

The "thickness adjustment base material layer forming step" of the third preferred embodiment including a step of forming the dummy conductors 5A and 5B in a region that has a small overlap with the conductor patterns 31 and 32 when the stacked plurality of insulating base material layers 11d, 12d, 13d, 14d, and 15d are viewed in the stacking direction (the Z-axis direction), the region being included in the insulating base material layer 13d.

Subsequently, when viewed in the Z-axis direction, the plurality of insulating base material layers 11d, 12d, 13d, 14d, and 15d are stacked such that the opening portion 2 is overlapped with the conductor patterns 31, 32, and 33, and the stacked plurality of insulating base material layers 11d, 12d, 13d, 14d, and 15d are heated and pressed to form a stacked body 10D (S3).

After the above described steps, a collective substrate is divided to an individual piece to obtain a multilayer substrate 103.

Fourth Preferred Embodiment

In a fourth preferred embodiment of the present invention, a description will be given of an example in which a plurality of thickness adjustment base material layers including a dummy conductor are provided.

Figure 13:
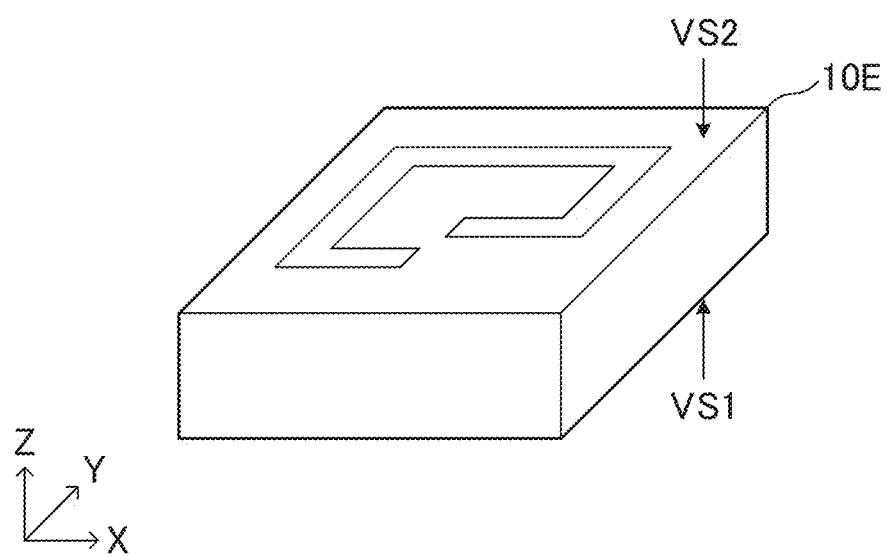
FIG. 13 is a perspective view of a multilayer substrate 104 according to a fourth preferred embodiment of the present invention.
Figure 14:
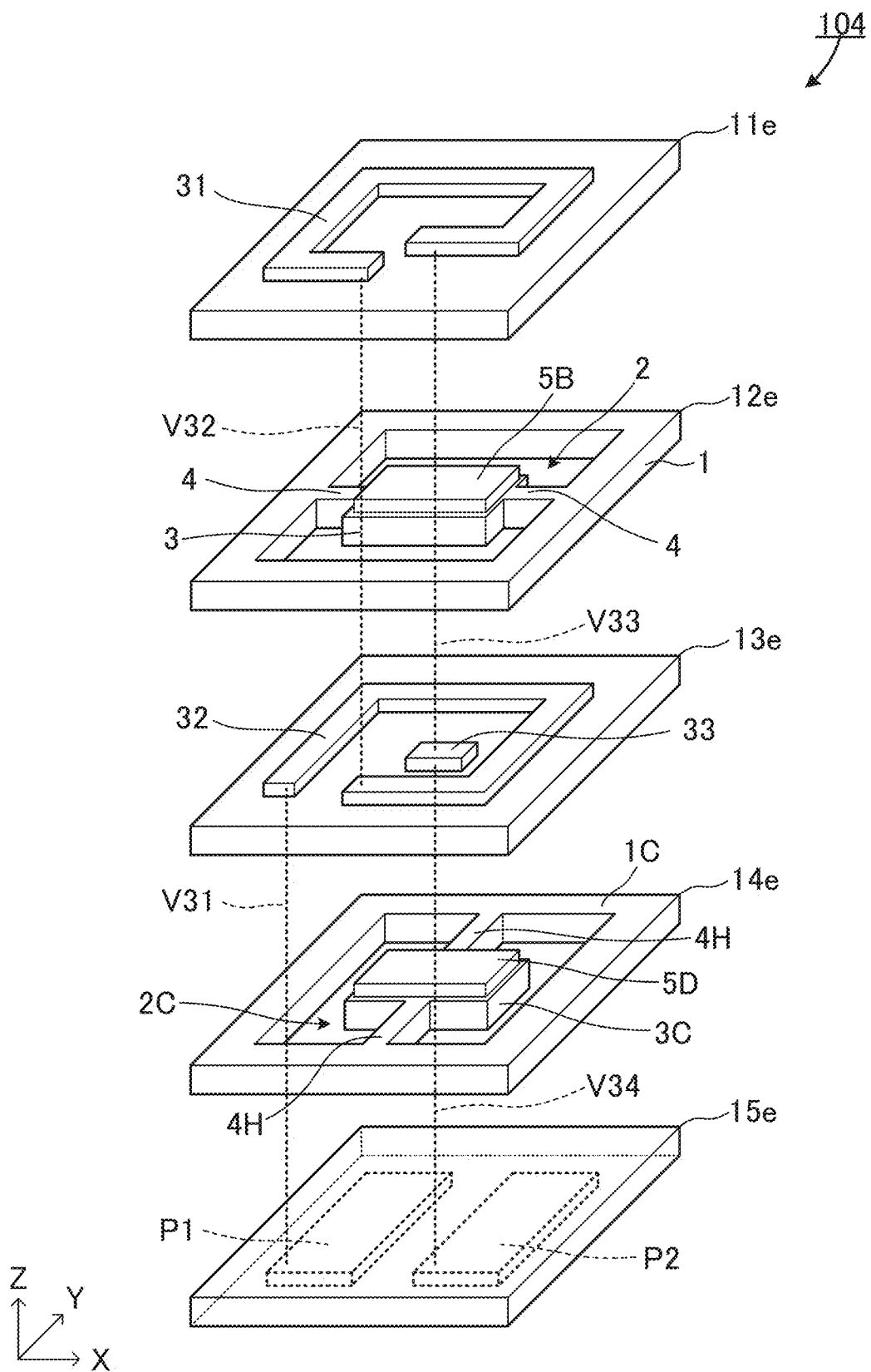
FIG. 14 is a perspective view of the multilayer substrate 104 according to the fourth preferred embodiment of the present invention.

FIG. 13 is a perspective view of a multilayer substrate 104 according to the fourth preferred embodiment of the present invention. FIG. 14 is an exploded perspective view of the multilayer substrate 104 according to the fourth preferred embodiment of the present invention.

The multilayer substrate 104 is different from the multilayer substrate 102 according to the second preferred embodiment in that a dummy conductor is provided on a thickness adjustment base material layer. In addition, the multilayer substrate 104 does not include an insulating base material layer corresponding to the insulating base material layer 11c described in the second preferred embodiment of the present invention. Other configurations are the same or substantially the same as the configurations of the multilayer substrate 102. Hereinafter, a description will be given of a portion that is different from the multilayer substrate 102 according to the second preferred embodiment of the present invention.

The multilayer substrate 104 includes a stacked body 10E formed by stacking a plurality of insulating base material layers 11e, 12e, 13e, 14e, and 15e. In the fourth preferred embodiment, each of the insulating base material layers 11e and 13e is the "conductor containing base material layer," and each of the insulating base material layers 12e and 14e is the "thickness adjustment base material layer." The configuration of the insulating base material layers 11e, 13e, and 15e is the same or substantially the same as the configuration of the insulating base material layers 12c, 14c, and 16c described in the second preferred embodiment of the present invention.

The configuration of the insulating base material layer 12e is the same or substantially the same as the configuration of the insulating base material layer 13c described in the second preferred embodiment of the present invention. A dummy conductor 5B is provided on the surface of the insulating base material layer 12e. The dummy conductor 5B is a rectangular or substantially rectangular conductor pattern having substantially the same shape as the shape of the island shaped portion 3.

The configuration of the insulating base material layer 15e is the same or substantially the same as the configuration of the insulating base material layer 15c described in the second preferred embodiment of the present invention. A dummy conductor 5D is provided on the surface of the insulating base material layer 15e. The dummy conductor 5D is a rectangular or substantially rectangular conductor pattern having substantially the same shape as the shape of the island shaped portion 3C.

In the fourth preferred embodiment, the thickness adjustment base material layer (the insulating base material layers 12e and 14e) is disposed at a position adjacent to the first principal surface VS1 and the second principal surface VS2 of the stacked body 10E. According to this configuration, during heating and pressing when the stacked body 10E is formed, the positional displacement of the conductor pattern 31 in the vicinity of the front surface of the stacked body that is particularly easy to deform is able to be significantly reduced or prevented.

It is to be noted that, while the fourth preferred embodiment describes an example in which all the thickness adjustment base material layers (the insulating base material layers 12e and 14e) include a dummy conductor, the present invention is not limited to this configuration. The stacked body of the present invention may be formed by stacking a conductor containing base material layer, a thickness adjustment base material layer including a dummy conductor, and a thickness adjustment base material layer including no dummy conductors.

Fifth Preferred Embodiment

In a fifth preferred embodiment of the present invention, a description will be given of an example in which a support conductor is provided on a conductor containing base material layer.

Figure 15:
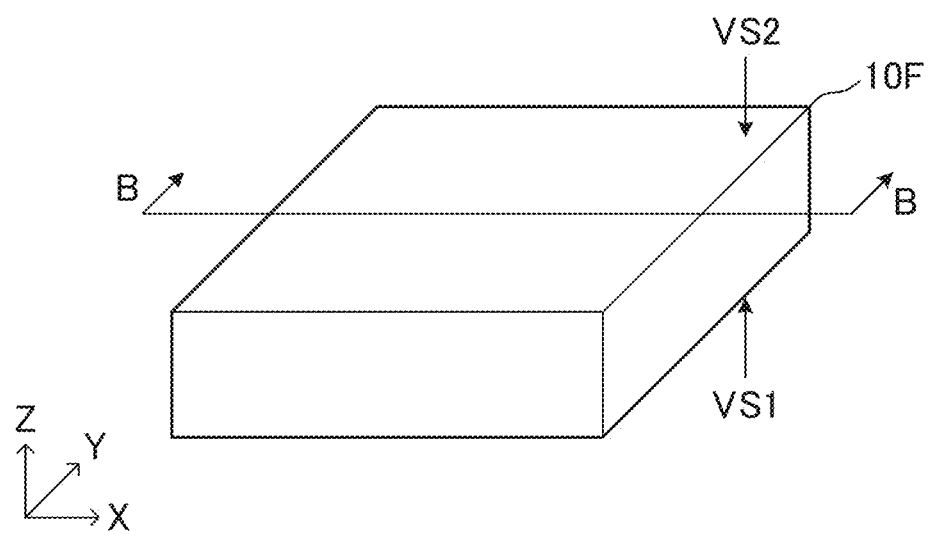
FIG. 15 is a perspective view of a multilayer substrate 105 according to a fifth preferred embodiment of the present invention.
Figure 16A:
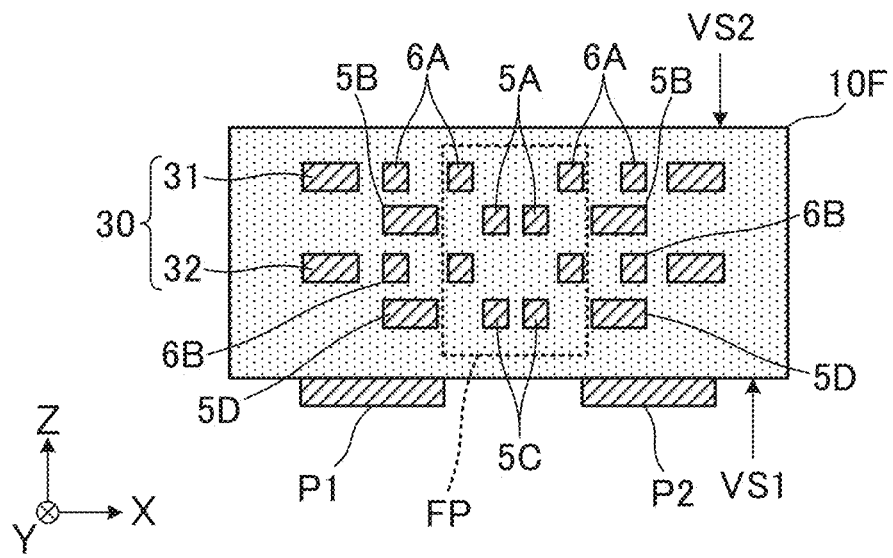
FIG. 16A is a B-B cross-sectional view in FIG. 15.
Figure 16B:
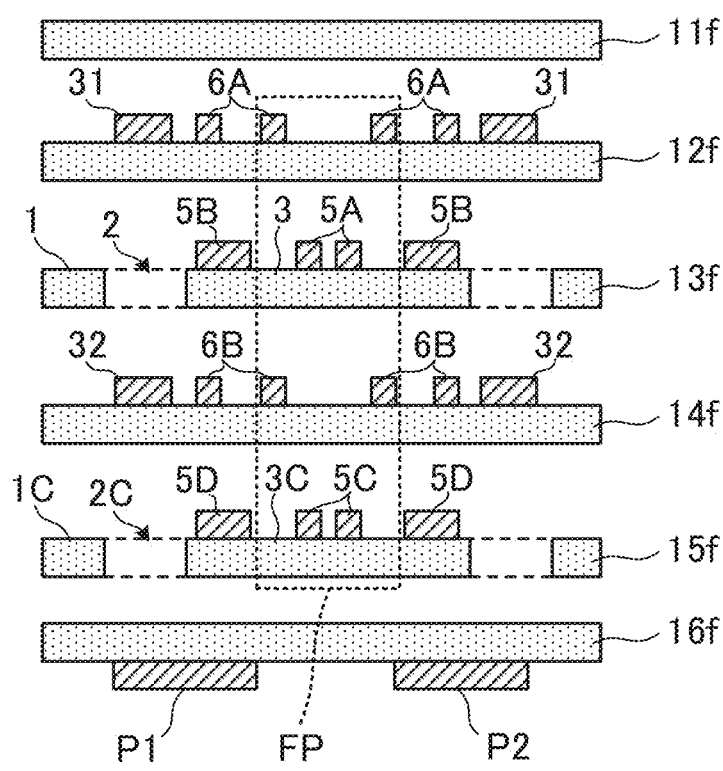
FIG. 16B is an exploded perspective view of the multilayer substrate 105.

FIG. 15 is a perspective view of a multilayer substrate 105 according to the fifth preferred embodiment of the present invention. FIG. 16A is a B-B cross-sectional view in FIG. 15, and FIG. 16B is an exploded perspective view of the multilayer substrate 105.

The multilayer substrate 105 is different from the multilayer substrate 102 according to the second preferred embodiment in that a dummy conductor is provided on a thickness adjustment base material layer and a support conductor is provided on a conductor containing base material layer. Other configurations are the same or substantially the same as the configurations of the multilayer substrate 102. Hereinafter, a description will be given of a portion that is different from the multilayer substrate 102 according to the second preferred embodiment of the present invention.

The multilayer substrate 105 includes a stacked body 10F formed by stacking a plurality of insulating base material layers 11f, 12f, 13f, 14f, 15f, and 16f. In the fifth preferred embodiment, each of the insulating base material layers 12f and 14f is the "conductor containing base material layer," and each of the insulating base material layers 13f and 15f is the "thickness adjustment base material layer." The configuration of the insulating base material layers 11f and 16f is the same or substantially the same as the configuration of the insulating base material layers 11c and 16c described in the second preferred embodiment of the present invention.

The configuration of the insulating base material layer 12f is the same or substantially the same as the configuration of the insulating base material layer 12c described in the second preferred embodiment of the present invention. A support conductor 6A is provided on the surface of the insulating base material layer 12f. The support conductor 6A is a spiral shaped conductor pattern, for example.

The configuration of the insulating base material layer 13f is the same or substantially the same as the configuration of the insulating base material layer 13c described in the second preferred embodiment of the present invention. Dummy conductors 5A and 5B are provided on the surface of the island shaped portion 3 of the insulating base material layer 13f. The dummy conductor 5A is a loop shaped conductor pattern, for example. The dummy conductor 5B is a loop shaped conductor pattern that is wound around the outer periphery of the dummy conductor 5A. The line width of the dummy conductor 5B is larger than the line width of the dummy conductor 5A.

The configuration of the insulating base material layer 14f is the same or substantially the same as the configuration of the insulating base material layer 14c described in the second preferred embodiment of the present invention. A support conductor 6B is provided on the surface of the insulating base material layer 14f. The support conductor 6B is a spiral shaped conductor pattern, for example.

The configuration of the insulating base material layer 15*f* is the same or substantially the same as the configuration of the insulating base material layer 15*c* described in the second preferred embodiment of the present invention. Dummy conductors 5C and 5D are provided on the surface of the island shaped portion 3 of the insulating base material layer 15*f*. The dummy conductor 5C is a loop shaped conductor pattern, for example. The dummy conductor 5D is a loop shaped conductor pattern that is wound around the outer periphery of the dummy conductor 5C. The line width of the dummy conductor 5D is larger than the line width of the dummy conductor 5C.

As illustrated in FIG. 16A and other drawings, the dummy conductors 5B and 5C, when viewed in the Z-axis direction, are disposed in a region surrounded by the loop shaped conductor patterns 31 and 32, and are disposed along with the inner periphery of the conductor patterns 31 and 32. Therefore, the dummy conductors 5B and 5C are disposed at positions closer to the conductor patterns 31 and 32 than to the dummy conductors 5A and 5C.

On the other hand, the dummy conductors 5A and 5C, as illustrated in FIG. 16B, when viewed in the Z-axis direction, are disposed at positions that are not overlapped with the support conductors 6A and 6B. In other words, the dummy conductors 5A and 5C provided on the thickness adjustment base material layers, when the plurality of insulating base material layers 11*f*, 12*f*, 13*f*, 14*f*, 15*f*, and 16*f* are stacked, are disposed so as to be fitted into the support conductors 6A and 6B provided on the conductor containing base material layers (see the fitting portion FP in FIG. 16B).

It is to be noted that the description that "the dummy conductors 5A and 5C are disposed so as to be fitted into the support conductors 6A and 6B" does not refer to a state in which the dummy conductors 5A and 5C and the support conductors 6A and 6B are fitted into each other so as to be disposed on the same layers in the stacking direction (the Z-axis direction). The description that "the dummy conductors 5A and 5C are disposed so as to be fitted into the support conductors 6A and 6B" refers to a state in which the dummy conductors 5A and 5C are disposed so as to roughly fill a portion in which the support conductors 6A and 6B are not provided when viewed in the Z-axis direction.

According to the multilayer substrate 105 according to the fifth preferred embodiment of the present invention, the following advantageous effects may be obtained.

In the fifth preferred embodiment, the dummy conductors 5B and 5D, when the plurality of insulating base material layers 11*f*, 12*f*, 13*f*, 14*f*, 15*f*, and 16*f* are stacked, are disposed so as to be fitted into the support conductors 6A and 6B. According to this configuration, the positional displacement of the dummy conductors 5A and 5B caused by the stacking displacement of the insulating base material layers or the flow of the insulating base material layers during heating and pressing is able to be significantly reduced or prevented.

While the fifth preferred embodiment describes an example in which the whole of the dummy conductor 5B and 5D are disposed so as to be fitted into the support conductors 6A and 6B, the present invention is not limited to this configuration. A portion of the dummy conductors 5B and 5D may be disposed so as to be fitted into the support conductors 6A and 6B. However, in view of the foregoing functions and effects, the whole of the dummy conductors 5B and 5D are preferably disposed so as to be fitted into the support conductors 6A and 6B.

In the fifth preferred embodiment, the dummy conductors 5B and 5C, when viewed in the Z-axis direction, are provided along the conductor patterns 31 and 32. According to this configuration, excessive flow of the insulating base material layers in the vicinity of the conductor patterns 31 and 32 during heating and pressing is significantly reduced or prevented. Therefore, the movement, deformation, or the like of the conductor patterns 31 and 32 caused by the flow of the insulating base material layers during heating and pressing is significantly reduced or prevented.

Further, in the fifth preferred embodiment, the dummy conductors 5B and 5D having a relatively large line width are disposed at positions closer to the conductor patterns 31 and 32 than the dummy conductors 5A and 5C. According to this configuration, in comparison with a case in which a dummy conductor having a relatively small line width is disposed adjacent to the conductor patterns 31 and 32, flow of the insulating base material layers during heating and pressing is significantly reduced or prevented.

Other Preferred Embodiments

While each of the above described preferred embodiments describes an example in which the stacked body has a rectangular or substantially rectangular parallelepiped shape, the present invention is not limited to this configuration. The planar shape of the stacked body is able to be appropriately changed within the scope of producing the functions and effects of preferred embodiments of the present invention, and may be a polygon, a circle, an ellipse, an L shape, a crank shape, a T shape, and a Y shape, for example.

In addition, while each of the above described preferred embodiments is a non-limiting example of a multilayer substrate including a stacked body formed by stacking five or six insulating base material layers, the present invention is not limited to this configuration. The number of layers (the number of "conductor containing base material layers" and "thickness adjustment base material layers") of the insulating base material layers forming the stacked body is able to be appropriately changed within the scope of producing the functions and effects of preferred embodiments of the present invention, and the number of conductor containing base material layers may be one.

While each of the above described preferred embodiments is a non-limiting example of a helical shaped coil of about two turns including a conductor pattern that is provided each of the plurality of insulating base material layers, the present invention is not limited to this configuration. In addition, a coil may be defined by a conductor pattern provided on one insulating base material layer. The shape of a coil may be a planar loop shape, a planar spiral shape, or the like, for example. In addition, the number of turns of the coil to be configured by a conductor pattern is able to be appropriately changed.

In addition, while each of the above described preferred embodiments is a non-limiting example in which the whole of the conductor patterns 31, 32, and 33, when viewed in the Z-axis direction, is wound around the island-shaped portion, the present invention is not limited to this configuration. At least a portion of the conductor patterns 31, 32, and 33, when viewed in the Z-axis direction, may be wound around the island shaped portion. It is to be noted that a conductor pattern with which a multilayer substrate is provided is not limited to application that defines a coil and may define a portion of a circuit provided in the multilayer substrate.

While each of the above described preferred embodiments is a non-limiting example in which the planar shape of the opening portion and the island shaped portion is a rectangular or substantially rectangular shape, the present invention is not limited to this configuration. The planar shape of the opening portion and the island shaped portion is able to be appropriately changed in the scope in which the functions and effects of the present invention are obtained.

While each of the above described preferred embodiments is a non-limiting example of a multilayer substrate in which the mounting electrodes P1 and P2 having a rectangular or substantially rectangular planar shape are provided on the first principal surface VS1, the present invention is not limited to this configuration. The mounting electrodes may be provided on the second principal surface VS2. In addition, the arrangement and the number of mounting electrodes are able to be appropriately changed by the circuit configuration of the multilayer substrate. In addition, the shape of the mounting electrodes is also able to be appropriately changed and may be a square, a polygon, a circle, an ellipse, an L shape, and a T shape, for example. It is to be noted that, in the multilayer substrates according to preferred embodiments of the present invention, the mounting electrode is not essential.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate comprising:
   a stacked body including a plurality of insulating base material layers;
   a conductor pattern provided on at least one of the plurality of insulating base material layers; and
   a dummy conductor; wherein
   the plurality of insulating base material layers includes:
      a conductor containing base material layer on which the conductor pattern is provided; and
      a thickness adjustment base material layer;
   the thickness adjustment base material layer includes:
      a base material portion; and
      a base material omitted portion in which the base material portion is not provided;
   the dummy conductor is provided on the thickness adjustment base material layer and is electrically isolated from the conductor pattern; and
   a number of the conductor pattern present on a straight line parallel or substantially parallel to a stacking direction in which the plurality of insulating base material layers are stacked in at least a portion of a first area where the dummy conductor is present, when viewed in the stacking direction, is less than a number of the conductor pattern present on a straight line parallel or substantially parallel to the stacking direction in at least a portion of a second area where the dummy conductor is not present and the conductor pattern is present, when viewed in the stacking direction.

2. The multilayer substrate according to claim 1, wherein the plurality of insulating base material layers are made of thermoplastic resin.

3. The multilayer substrate according to claim 1, wherein the conductor pattern defines a coil.

4. The multilayer substrate according to claim 1, wherein
   the base material omitted portion includes an opening provided inside of the base material portion;
   the thickness adjustment base material layer includes:
      an island shaped portion disposed inside of the base material omitted portion; and
      a plurality of connection portions;
   at least a portion of the conductor pattern is wound around the island shaped portion when viewed in the stacking direction;
   a line width of the plurality of connection portions is smaller than a width of the island shaped portion;
   the island shaped portion is connected to the base material portion through the plurality of connection portions; and
   the base material omitted portion, when viewed in the stacking direction, includes an area overlapped with the conductor pattern, the area being larger than an area in which the island shaped portion is overlapped with the conductor pattern.

5. The multilayer substrate according to claim 4, wherein a geometric gravity center of the island shaped portion is located in a maximum region surrounded by a straight line connecting a plurality of boundaries between the plurality of connection portions and the base material portion.

6. The multilayer substrate according to claim 1, wherein the dummy conductor, when viewed in the stacking direction, is disposed at a position that is not overlapped with the conductor pattern.

7. The multilayer substrate according to claim 1, wherein the thickness adjustment base material layer includes a plurality of thickness adjustment base material layers.

8. The multilayer substrate according to claim 4, wherein the thickness adjustment base material layer includes a plurality of thickness adjustment base material layers.

9. The multilayer substrate according to claim 8, wherein the plurality of connection portions respectively provided on the plurality of thickness adjustment base material layers are disposed at positions at which the plurality of connection portions provided on the plurality of thickness adjustment base material layers are not overlapped with each other when viewed in the stacking direction.

10. The multilayer substrate according to claim 1, wherein
    the conductor containing base material layer includes a plurality of conductor containing base material layers;
    the plurality of conductor containing base material layers include an interlayer connection conductor to connect a plurality of conductor patterns respectively provided on the plurality of conductor containing base material layers; and
    the interlayer connection conductor is overlapped with the base material omitted portion when viewed in the stacking direction.

* * * * *